United States Patent
Ishihara

(10) Patent No.: US 9,673,830 B2
(45) Date of Patent: Jun. 6, 2017

(54) ATOMIC CELL, MANUFACTURING METHOD FOR ATOMIC CELL, QUANTUM INTERFERENCE DEVICE, ATOMIC OSCILLATOR, ELECTRONIC APPARATUS, AND MOVING OBJECT

(71) Applicant: Seiko Epson Corporation, Tokyo (JP)

(72) Inventor: Naoki Ishihara, Chino (JP)

(73) Assignee: Seiko Epson Corporation (JP)

( * ) Notice: Subject to any disclaimer, the term of this patent is extended or adjusted under 35 U.S.C. 154(b) by 66 days.

(21) Appl. No.: 14/621,601

(22) Filed: Feb. 13, 2015

(65) Prior Publication Data

US 2015/0244382 A1 Aug. 27, 2015

(30) Foreign Application Priority Data

Feb. 14, 2014 (JP) .................................. 2014-027032

(51) Int. Cl.
| | |
|---|---|
| *H01S 1/06* | (2006.01) |
| *H03B 17/00* | (2006.01) |
| *H03L 7/26* | (2006.01) |
| *G04F 5/14* | (2006.01) |

(52) U.S. Cl.
CPC ................ *H03L 7/26* (2013.01); *G04F 5/145* (2013.01); *Y10T 29/49885* (2015.01)

(58) Field of Classification Search
CPC ......... H03L 7/26; Y10T 29/49885; H01S 1/06
USPC .................................................... 331/94.1, 3
See application file for complete search history.

(56) References Cited

U.S. PATENT DOCUMENTS

| | | | | |
|---|---|---|---|---|
| 3,827,776 A | * | 8/1974 | Nakayama | ............... H01J 11/00 313/587 |
| 7,292,031 B2 | * | 11/2007 | Abbink | .................. G01C 19/60 324/304 |
| 7,292,111 B2 | * | 11/2007 | Abbink | ..................... G04F 5/14 331/3 |
| 2005/0184815 A1 | | 8/2005 | Lipp et al. | |
| 2010/0201452 A1 | * | 8/2010 | Aoyama | ............... G02F 1/0126 331/3 |
| 2012/0206135 A1 | * | 8/2012 | Nagasaka | .............. G01R 33/26 324/244.1 |

FOREIGN PATENT DOCUMENTS

| | | |
|---|---|---|
| JP | 2007-165496 A | 6/2007 |
| JP | 2009-283526 A | 12/2009 |
| JP | 2010-223661 A | 10/2010 |
| JP | 2013-041970 A | 2/2013 |

\* cited by examiner

*Primary Examiner* — Richard Tan
(74) *Attorney, Agent, or Firm* — Harness, Dickey & Pierce, P.L.C.

(57) ABSTRACT

An atomic cell includes an internal space in which alkali metals are encapsulated, a coating film formed on the wall surface of the internal space, holes that allow the internal space and the outside to communicate with each other, and coating members having surfaces that face the internal space along openings of the holes on the internal space side and formed of a coating material having a characteristic same as or similar to a characteristic of the coating film.

20 Claims, 19 Drawing Sheets

ATOMIC CELL, MANUFACTURING METHOD FOR ATOMIC CELL, QUANTUM INTERFERENCE DEVICE, ATOMIC OSCILLATOR, ELECTRONIC APPARATUS, AND MOVING OBJECT

BACKGROUND

1. Technical Field

The present invention relates to an atomic cell, a manufacturing method for the atomic cell, a quantum interference device, an atomic oscillator, an electronic apparatus, and a moving object.

2. Related Art

As an oscillator having a highly accurate oscillation characteristic for a long period, there is known an atomic oscillator that oscillates on the basis of energy transition of atoms of alkali metal such as rubidium or cesium.

In general, operation principles of atomic oscillators are roughly classified into a system that makes use of a double resonance phenomenon by light and a microwave and a system that makes use of a quantum interference effect (CPT: Coherent Population Trapping) by two kinds of light having different wavelengths. Both the atomic oscillators include a gas cell (an atomic cell) in which alkali metal is encapsulated (see, for example, United States Patent Application Publication No. 2005/0184815 (Patent Literature 1)).

As such an atomic cell, as disclosed in Patent Literature 1, there is known an atomic cell in which a hole piercing through the atomic cell is sealed by glass. In the atomic cell disclosed in Patent Literature 1, coating for preventing reaction or diffusion of the alkali metal to the glass forming an inner wall surface is applied to the inner wall surface.

However, in the atomic cell disclosed in Patent Literature 1, coating is not applied to an inner side opening of the hole for sealing. Therefore, the behavior of the alkali metal becomes unstable. As a result, there is a problem in that frequency stability is deteriorated. The hole for sealing is used, for example, when the alkali metal is introduced into an internal space. Therefore, a certain degree of size has to be secured for the hole for sealing. On the other hand, in recent years, there is a demand for a small atomic cell according to a demand for a reduction in the size of an atomic oscillator. A ratio of the area of an opening of the hole for sealing to the area of the inner wall surface of the atomic cell increases. Therefore, such a problem becomes conspicuous.

SUMMARY

An advantage of some aspects of the invention is to provide an atomic cell, a manufacturing method for the atomic cell, a quantum interference device, and an atomic oscillator that can stabilize the behavior of metal atoms and improve frequency stability and provide an electronic apparatus and a moving object excellent in reliability including such a quantum interference device.

The invention can be implemented as the following aspects or application examples.

Application Example 1

An atomic cell according to this application example includes: a wall section configuring an internal space in which metal atoms are encapsulated; a coating film arranged on the wall section; a through-hole configured to allow the internal space and the outside to communicate with each other and pierce through the wall surface; and a coating member including a material having a characteristic same as or similar to a characteristic of the coating film in an opening of the through-hole in plan view from the internal space side.

With the atomic cell, a surface formed of the coating material having the characteristic same as or similar to the characteristic of the coating film is also provided near the opening of the through-hole on the internal space side. Therefore, it is possible to stabilize the behavior of the metal atoms and, as a result, improve frequency stability.

Application Example 2

In the atomic cell according to the application example described above, it is preferable that at least a part of the coating member is arranged in the through-hole.

With this configuration, it is possible to relatively easily arrange, near the opening of the through-hole on the internal space side, the surface formed of the material having the characteristic same as or similar to the material of the coating film.

Application Example 3

In the atomic cell according to the application example described above, it is preferable that the atomic cell further includes a sealing material arranged further on the outer side than the coating member in the through-hole and configured to seal the internal space.

With this configuration, it is possible to provide, near the opening of the through-hole on the internal space side, the surface formed of the material having the characteristic same as or similar to the characteristic of the coating film and seal the through-hole.

Application Example 4

In the atomic cell according to the application example described above, it is preferable that the sealing material include glass.

With this configuration, it is possible to melt the sealing material at a relatively low temperature and seal the through-hole. Therefore, it is possible to prevent or reduce melting of the coating material of the coating member due to heat during the sealing and easily and surely provide, near the opening of the through-hole on the internal space side, the surface formed of the material having the characteristic same as or similar to the characteristic of the coating film.

Application Example 5

In the atomic cell according to the application example described above, it is preferable that the atomic cell further includes a cushioning material arranged between the sealing material and the coating member.

With this configuration, it is possible to prevent or reduce transfer of the heat of the sealing material to the coating member. Therefore, it is possible to prevent or reduce melting of the coating material of the coating member due to heat during the sealing and easily and surely provide, near the opening of the through-hole on the internal space side, the surface formed of the material having the characteristic same as or similar to the characteristic of the coating film.

Application Example 6

In the atomic cell according to the application example described above, it is preferable that a melting point of the cushioning material is lower than a melting point of the sealing material.

With this configuration, it is possible to melt the cushioning material as well to seal the through-hole and improve airtightness. By setting the melting point of the cushioning material lower than the melting point of the sealing material, even if the cushioning material is melted, it is possible to prevent or reduce melting of the coating material of the coating member due to heat during the melting of the cushioning material.

Application Example 7

In the atomic cell according to the application example described above, it is preferable that the coating film includes at least any one of fluorine-based resin, a siloxane-based compound, and chain saturated hydrocarbon.

With this configuration, it is possible to effectively reduce a change in the behavior of the metal atoms when the metal atoms collide against the coating film. The coating film is excellent in chemical stability. It is possible to set the boiling point of the coating material higher than the boiling point of the metal atoms.

Application Example 8

In the atomic cell according to the application example described above, it is preferable that the coating material includes at least any one of fluorine-based resin, a siloxane-based compound, and chain saturated hydrocarbon.

With this configuration, it is possible to effectively reduce a change in the behavior of the metal atoms when the metal atoms collide against the coating member. The coating material is excellent in chemical stability. It is possible to set the boiling point of the coating material higher than the boiling point of the metal atoms.

Application Example 9

A manufacturing method for an atomic cell according to this application example includes: preparing a structure including an internal space and a through-hole that allows the internal space and the outside to communicate with each other, metal atoms being arranged in the internal space and a coating film being arranged on a wall section of the internal space; arranging a coating member and a sealing material in the through-hole; and melting the sealing material to seal the through-hole in a state in which the coating member faces the internal space.

With the manufacturing method for an atomic cell, it is possible to hermetically seal the internal space in which the metal atoms are encapsulated and obtain the atomic cell in which a surface formed of a coating material having a characteristic same as or similar to a characteristic of the coating film is also provided near an opening of the through-hole on the internal space side.

Application Example 10

A quantum interference device according to this application example includes: the atomic cell according to the application example described above; a light emitting unit configured to emit excitation light for exciting the metal atoms; and a light detecting unit configured to detect the excitation light transmitted through the atomic cell.

With this configuration, it is possible to provide the quantum interference device having excellent frequency stability.

Application Example 11

In the quantum interference device according to the application example described above, it is preferable that the atomic cell includes: a pair of window sections through which the excitation light is transmitted; and a body section arranged between the pair of window sections, and the opening of the through-hole on the internal space side is arranged in the window section.

With this configuration, it is easy to seal the through-hole with the sealing material and arrange the coating member in the through-hole.

Application Example 12

In the quantum interference device according to the application example described above, it is preferable that the atomic cell includes: a pair of window sections through which the excitation light is transmitted; and a body section arranged between the pair of window sections, and the opening of the through-hole on the internal space side is arranged in the body section.

With this configuration, when viewed from a transmitting direction of the excitation light in the internal space, it is possible to arrange the through-hole in a position where the through-hole does not overlap the internal space. Therefore, it is possible to increase the size of a transmission area of the excitation light in the internal space.

Application Example 13

An atomic oscillator according to this application example includes the atomic cell according to the application example described above.

With this configuration, it is possible to provide the atomic oscillator having excellent frequency stability.

Application Example 14

An electronic apparatus according to this application example includes the atomic cell according to the application example described above.

With this configuration, it is possible to provide the electronic apparatus having excellent reliability.

Application Example 15

A moving object according to this application example includes the atomic cell according to the application example described above.

With this configuration, it is possible to provide the moving object having excellent reliability.

BRIEF DESCRIPTION OF THE DRAWINGS

The invention will be described with reference to the accompanying drawings, wherein like numbers reference like elements.

DESCRIPTION OF EXEMPLARY EMBODIMENTS

An atomic cell, a manufacturing method for an atomic cell, a quantum interference device, an atomic oscillator, an electronic apparatus, and a moving object according to the invention are explained in detail below on the basis of embodiments shown in the accompanying drawings.

1. Atomic Oscillator

First, an atomic oscillator according to the invention (an atomic oscillator including a quantum interference device according to the invention) is explained. Note that, in the following explanation, an example is explained in which the quantum interference device according to the invention is applied to the atomic oscillator. However, the quantum interference device according to the invention is not limited to this. Besides the atomic oscillator, the quantum interference device is also applicable to, for example, a magnetic sensor and a quantum memory.

First Embodiment

Figure 1:
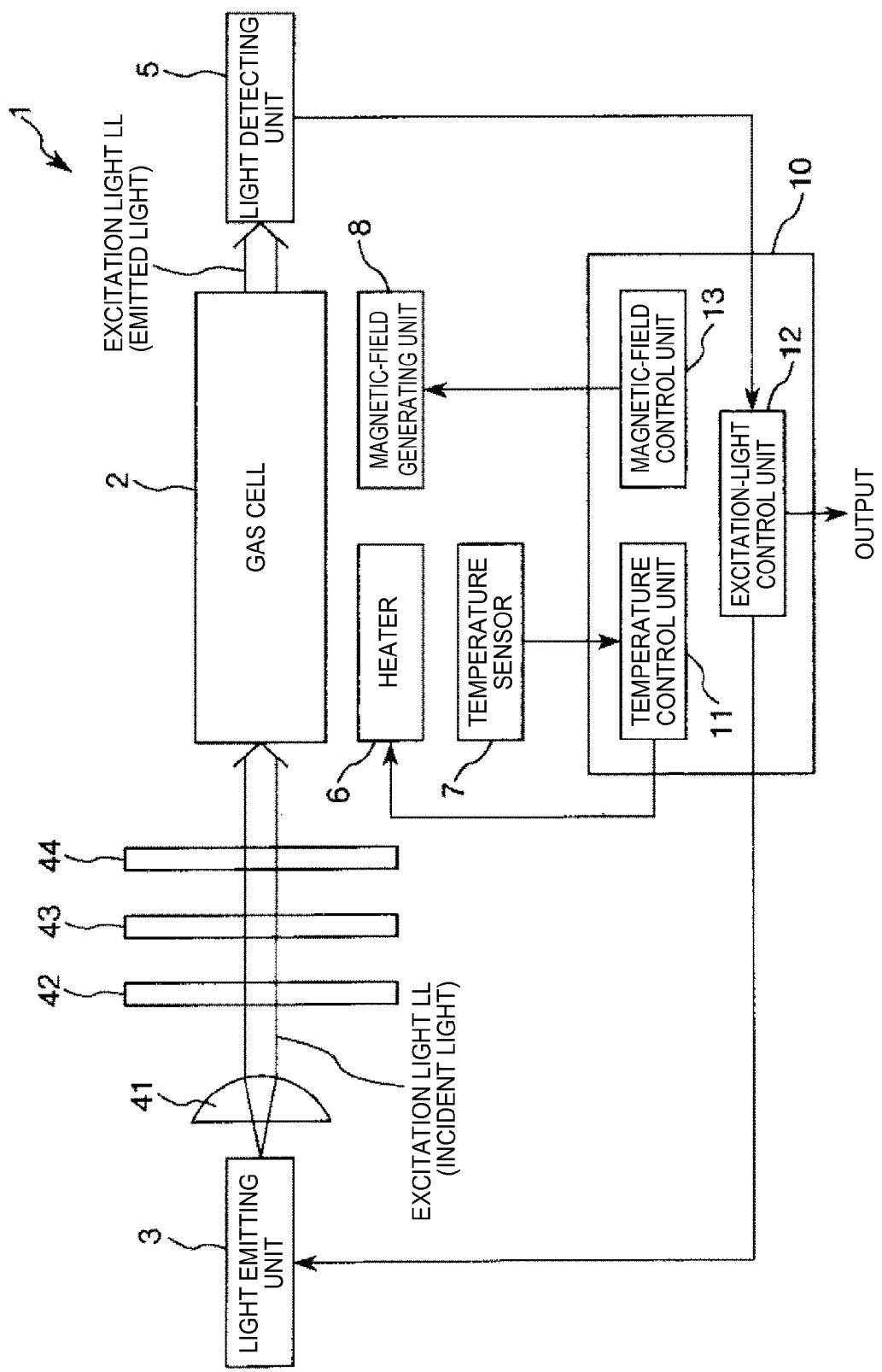
FIG. 1 is a schematic diagram showing an atomic oscillator (a quantum interference device) according to a first embodiment of the invention.
Figure 2:
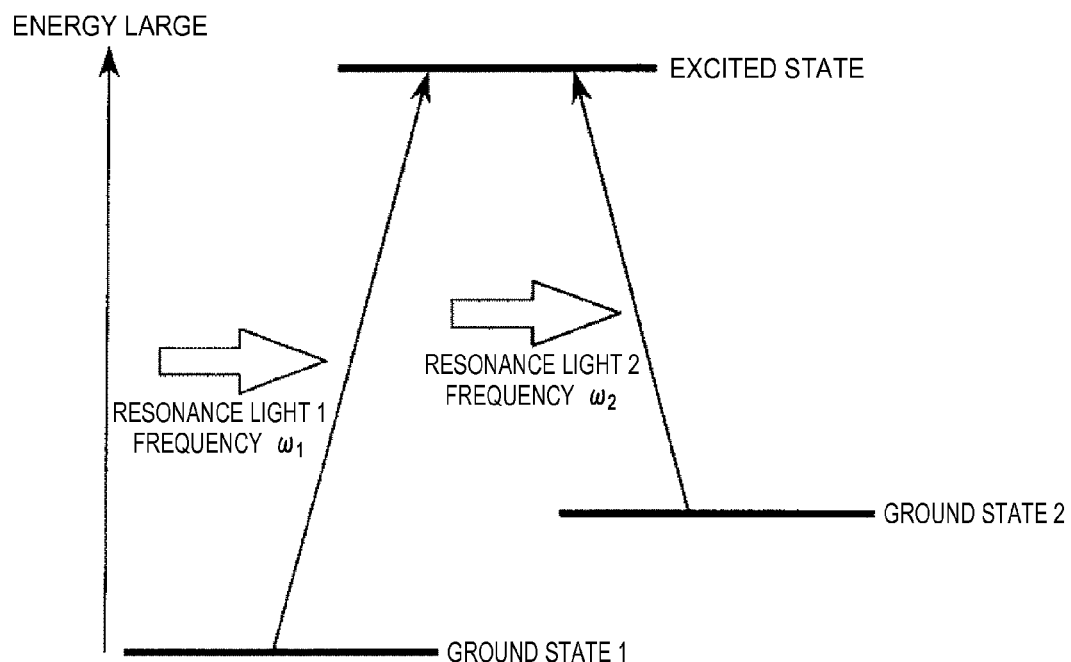
FIG. 2 is a diagram for explaining an energy state of alkali metal in a gas cell of the atomic oscillator shown in FIG. 1.
Figure 3:
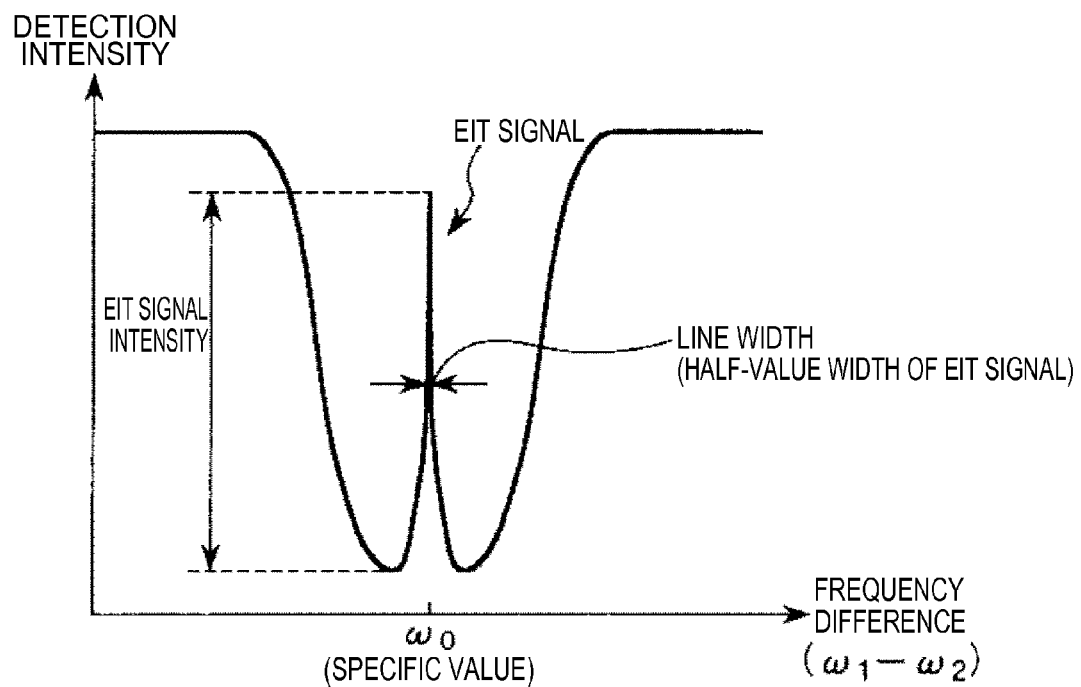
FIG. 3 is a graph showing, concerning a light emitting unit and a light detecting unit of the atomic oscillator shown in FIG. 1, a relation between a frequency difference of two lights from the light emitting unit and detection intensity in the light detecting unit.
Figure 4:
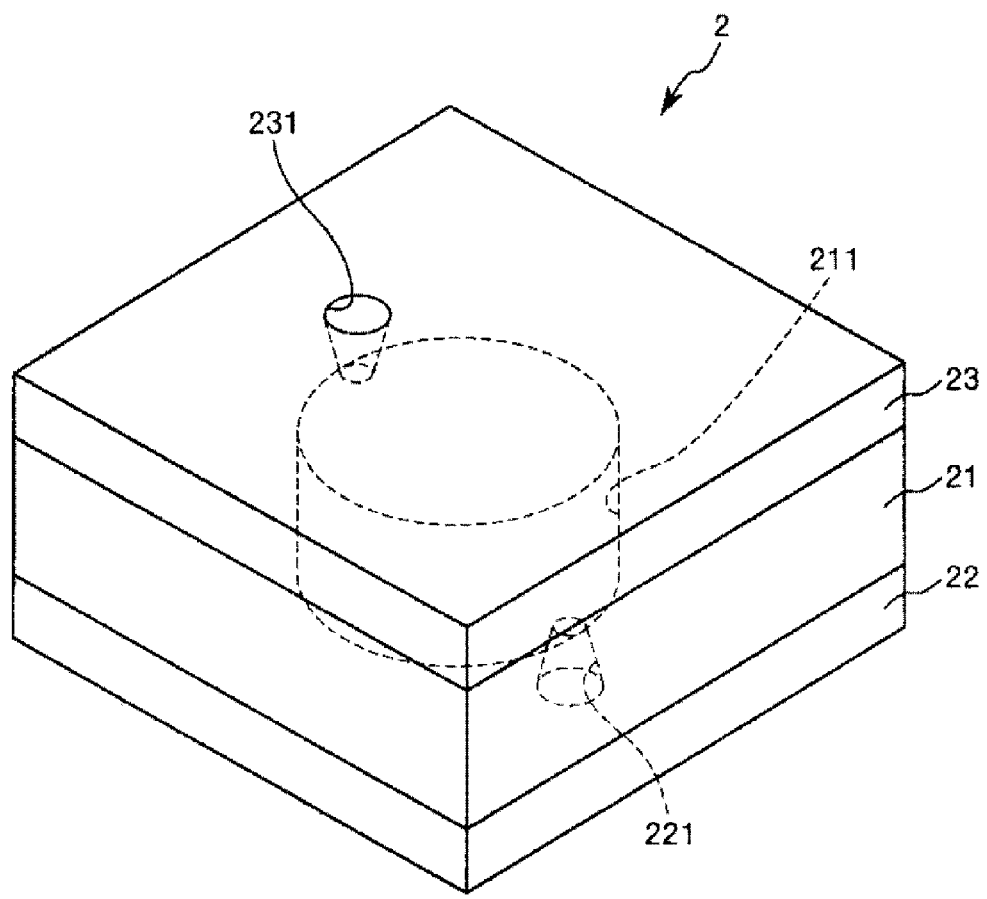
FIG. 4 is a perspective view of the gas cell included in the atomic oscillator shown in FIG. 1.
Figure 5:
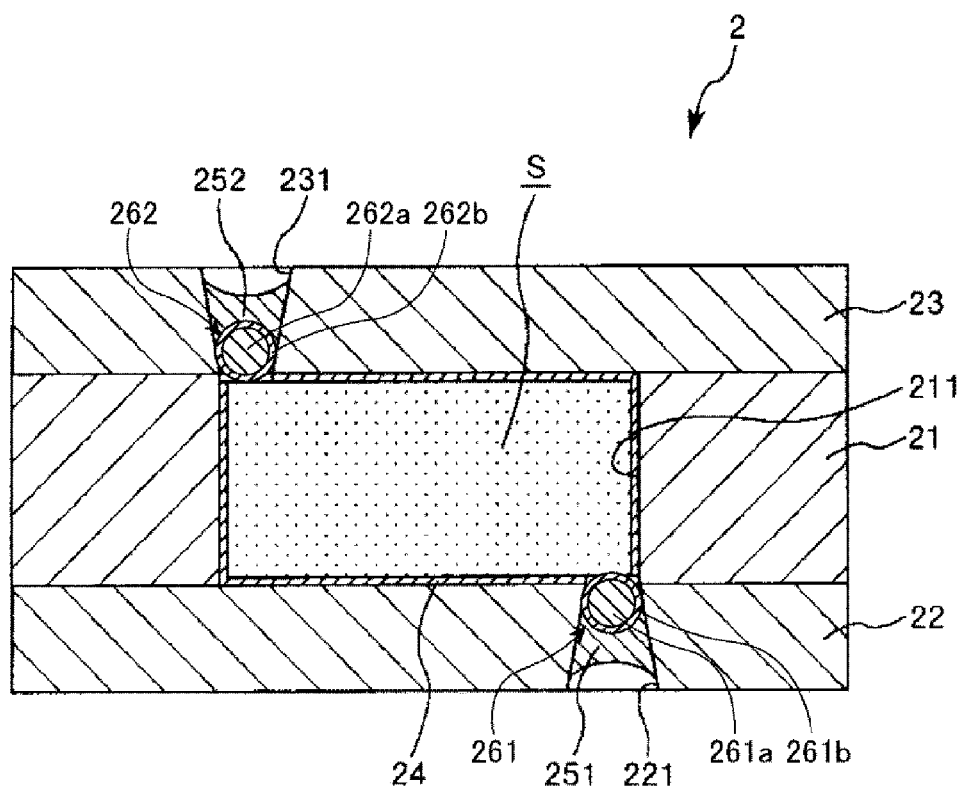
FIG. 5 is a sectional view of the gas cell shown in FIG. 4.

FIG. 1 is a schematic diagram showing an atomic oscillator (a quantum interference device) according to a first embodiment of the invention. FIG. 2 is a diagram for explaining an energy state of alkali metal in a gas cell of the atomic oscillator shown in FIG. 1. FIG. 3 is a graph showing, concerning a light emitting unit and a light detecting unit of the atomic oscillator shown in FIG. 1, a relation between a frequency difference of two lights from the light emitting unit and detection intensity in the light detecting unit. FIG. 4 is a perspective view of the gas cell included in the atomic oscillator shown in FIG. 1. FIG. 5 is a sectional view of the gas cell shown in FIG. 4.

An atomic oscillator 1 shown in FIG. 1 is an atomic oscillator that makes use of a quantum interference effect. The atomic oscillator 1 that makes use of the quantum interference effect can be reduced in size compared with an atomic oscillator that makes use of a double resonance effect.

The atomic oscillator 1 includes, as shown in FIG. 1, a gas cell 2 (an atomic cell), a light emitting unit 3, optical components 41, 42, 43, and 44, a light detecting unit 5, a heater 6, a temperature sensor 7, a magnetic-field generating unit 8, and a control unit 10.

First, the principle of the atomic oscillator 1 is briefly explained.

In the atomic oscillator 1, gaseous alkali metal (metal atoms) such as rubidium, cesium, or sodium is encapsulated.

As shown in FIG. 2, the alkali metal has energy levels of a three level system. The alkali metal can take three states, i.e., two ground states (ground states 1 and 2) having different energy levels and an excited state. The ground state 1 is an energy state lower than the ground state 2.

When two kinds of resonance lights 1 and 2 having different frequencies are irradiated on the gaseous alkali metal, light absorptance (light transmittance) in the alkali metal in the resonance lights 1 and 2 changes according to a difference ($\omega_1-\omega_2$) between a frequency $\omega_1$ of the resonance light 1 and a frequency $\omega_2$ of the resonance light 2.

When the difference ($\omega_1-\omega_2$) between the frequency $\omega_1$ of the resonance light 1 and the frequency $\omega_2$ of the resonance light 2 coincides with a frequency equivalent to an energy difference between the ground state 1 and the ground state 2, excitations from the ground states 1 to 2 to the excited state are respectively stopped. In this case, both of the resonance lights 1 and 2 are transmitted through the alkali metal without being absorbed by the alkali metal. Such a phenomenon is called CPT phenomenon or electromagnetically induced transparency (EIT).

The light emitting unit 3 emits the two kinds of light (the resonance light 1 and the resonance light 2) having the different frequencies to the gas cell 2.

For example, if the frequency $\omega_1$ of the resonance light 1 is fixed and the frequency $\omega_2$ of the resonance light 2 is changed, when the difference ($\omega_1-\omega_2$) between the frequency $\omega_1$ of the resonance light 1 and the frequency $\omega_2$ of the resonance light 2 coincides with a frequency $\omega_0$ equivalent to the energy difference between the ground state 1 and the ground state 2, as shown in FIG. 3, detection intensity of the light detecting unit 5 sharply increases. Such a sharp signal is referred to as EIT signal. The EIT signal has an eigenvalue determined by a type of alkali metal. Therefore, by using the EIT signal as a reference, it is possible to realize a highly accurate oscillator.

The units of the atomic oscillator 1 are explained in detail below in order.

Gas Cell

In the gas cell 2, gaseous alkali metal (metal atoms) such as rubidium, cesium, or sodium is encapsulated. In the gas cell 2, a rare gas such as argon or neon or an inert gas such as nitrogen may be encapsulated as a buffer gas together with an alkali metal gas according to necessity.

As shown in FIGS. 4 and 5, the gas cell 2 includes a body section 21 and a pair of window sections 22 and 23 provided to sandwich the body section 21. The body section 21 and the window sections 22 and 23 function as wall sections.

In the body section 21, a columnar through-hole 211 is formed. Note that a cross sectional shape of the through-hole 211 is not limited to a circular shape and may be, for example, a polygonal shape such as a square shape or a pentagonal shape or an elliptical shape.

A material forming the body section 21 is not particularly limited. A glass material, quartz, a metal material, a resin material, a silicon material, and the like can be used. However, anyone of the glass material, the quartz, and the silicon material is preferably used. The silicon material is more preferably used. Consequently, even when the gas cell 2 small in size having width and height equal to or smaller than 10 mm is formed, it is possible to easily form the body section 21 having high accuracy using a micro-fabrication technique such as etching. When the window sections 22 and 23 are formed of the glass material, the body section 21 formed of the silicon material can be easily hermetically joined to the window sections 22 and 23 by an anodic joining method.

The window section 22 is joined to one end face of the body section 21. On the other hand, the window section 23 is jointed to the other end face of the body section 21.

A joining method for the body section 21 and the window sections 22 and 23 is determined according to these constituent materials and is not particularly limited as long as the body section 21 and the window sections 22 and 23 can be hermetically joined. However, for example, a joining method by an adhesive, a direct joining method, and an anodic joining method can be used.

One end opening of the through-hole 211 is blocked by the window section 22. On the other hand, the other end opening of the through-hole 211 is blocked by the window section 23. Consequently, an internal space S in which the alkali metal is encapsulated is formed. Note that, although not shown in the figure, a part of the alkali metal encapsulated in the internal space S is present in a gaseous state. The remaining part of the alkali metal is present in a liquid state or a solid state as the remainder. The gaseous alkali metal stored in the internal space S is excited by excitation light LL.

The window sections 22 and 23 are formed in a tabular shape. The window sections 22 and 23 are set such that plate surfaces thereof are perpendicular to the axis of the excitation light LL. The window sections 22 and 23 have transparency for excitation light emitted from the light emitting unit 3. One window section 22 is an incidence side window section through which the excitation light LL is made incident on the internal space S of the gas cell 2. The other window section 23 is an emission side window section through which the excitation light LL is emitted from the internal space S of the gas cell 2.

Coating is applied to the inner wall surface of the internal space S. That is, a coating film 24 is formed on the inner wall surface of the internal space S.

The coating film 24 has a function of suppressing or reducing a change in the behavior (e.g., spin) of the gaseous alkali metal when the gaseous alkali metal collides against the inner wall surface of the internal space S. Consequently, even if the gas cell 2 is reduced in size, it is possible to suppress the change in the behavior due to the collision of the alkali metal against the inner wall surface of the gas cell 2 from adversely affecting the characteristic of the atomic oscillator 1. It is possible to improve the oscillation characteristic of the atomic oscillator 1.

The constituent material of the coating film 24 preferably includes fluorine-based resin, a siloxane-based compound, or chain saturated hydrocarbon. Consequently, it is possible to effectively reduce a change in the behavior of the alkali metal when the alkali metal collides with the coating film 24. The coating film 24 is excellent in chemical stability. It is possible to set the boiling point of the coating material higher than the boiling point of the metal atoms.

Note that the coating material used for the formation of the coating film 24, that is, the constituent material of the coating film 24 or a precursor of the constituent material is more specifically explained in explanation of a manufacturing method for the gas cell 2 below.

In particular, in the window section 22, a hole 221 (a through-hole) that allows the internal space S and the outside to communicate with each other is formed. The hole 221 is sealed by a sealing material 251. Similarly, in the window section 23, a hole 231 (a through-hole) that allows the internal space S and the outside to communicate with each other is formed. The hole 231 is sealed by a sealing material 252. In the hole 221, a coating member 261 is arranged on the internal space S side with respect to the sealing material 251. Similarly, in the hole 231, a coating member 262 is arranged on the internal space S side with respect to the sealing material 252.

As explained below in detail, when the gas cell 2 is manufactured, after the joining of the body section 21 and the window sections 22 and 23 and before the sealing by the sealing materials 251 and 252, the holes 221 and 231 are used for feeding the alkali metal and the coating material into the internal space S. Consequently, it is possible to easily apply coating to the inner wall surface of the gas cell 2. In particular, it is possible to uniformly form coating on the inner wall surface of the gas cell 2. Therefore, it is possible to suitably exhibit the function of the coating film 24 explained above.

The holes 221 and 231 pierce through the window sections 22 and 23 in the thickness direction thereof. Consequently, even when one structure 20 is singulated to obtain a plurality of the gas cells 2 as in the manufacturing of the gas cell 2 explained below, before the singulation, it is possible to easily feed the alkali metal and the coating material into the internal space S through the hole 231 and seal the holes 221 and 231 (see FIGS. 7A to 8C).

The cross sectional shape of the holes 221 and 231 is a circular shape (see FIG. 4). Note that the cross sectional shape of the holes 221 and 231 is not limited to the circular shape and may be, for example, a polygonal shape such as a triangular shape, a square shape, or a pentagonal shape or an elliptical shape.

The holes 221 and 231 are formed in a shape with width decreasing toward the internal space S side. That is, in this embodiment, the holes 221 and 231 are formed in a truncated cone shape. Since the width of the holes 221 and 231 decreases toward the internal space S side, the sealing material and the coating members 261 and 262 are retained and arranged in the holes 221 and 231 before the sealing by the sealing materials 251 and 252. After the sealing by the sealing materials 251 and 252, even if the coating members 261 and 262 are not joined and fixed to the sealing materials 251 and 252, it is possible to prevent the coating members 261 and 262 from separating to the internal space S side.

The minimum width of the holes 221 and 231 is preferably equal to or larger than 50 μm and equal to or smaller than 1000 µm and more preferably equal to or larger than 70 µm and equal to or smaller than 500 µm. Consequently, it is possible to easily introduce the alkali metal and the coating material into the internal space S through the holes 221 and 231 in a manufacturing process explained below while realizing a reduction in the size of the gas cell 2.

A material forming the window sections 22 and 23 is not particularly limited as long as the material has the transparency to excitation light explained above. Examples of the material include a glass material and quartz. However, the glass material is preferably used. Consequently, when the body section 21 is formed of a silicon material, the body section 21 and the window sections 22 and 23 can be easily hermetically joined by the anodic joining. Note that, depending on the thickness of the window sections 22 and 23 and the intensity of the excitation light, the window sections 22 and 23 can also be formed of silicon. In this case, the body section 21 may be formed of the glass material. The body section 21 and the window sections 22 and 23 may be anodically joined. Alternatively, the body section 21 may be formed of the silicon material. The body section 21 and the window sections 22 and 23 may be directly joined. On the inner wall surfaces of the holes 221 and 231, a metalized layer of, for example, nickel, chrome, or gold may be formed according to necessity for the purpose of, for example, improving adhesion with the sealing materials 251 and 252 and wettability during the sealing.

The coating member 261 has a surface facing the internal space S along an opening of the hole 221 on the internal space S side. The surface is formed of a coating material having a characteristic same as or similar to the characteristic of the coating film 24 (hereinafter also simply referred to as "coating material"). Similarly, the coating member 262 has a surface facing the internal space S along an opening of the hole 231 on the internal space S side. The surface is formed of a coating material having a characteristic same as or similar to the characteristic of the coating film 24. That is, the coating members 261 and 262 include a material having a characteristic same as or similar to the characteristic of the coating film 24 in the openings of the holes 221 and 231 in plan view from the internal space S side.

By providing the coating members 261 and 262, the surfaces formed of the coating material having the characteristic same as or similar to the characteristic of the coating film 24 are provided near the openings of the holes 221 and 231 on the internal space S side. Therefore, it is possible to stabilize the behavior of the alkali metal in the internal space S and, as a result, improve frequency stability.

Since the coating members 261 and 262 are arranged in the holes 221 and 231, it is possible to relatively easily arrange, near the openings of the holes 221 and 231 on the internal space S side, the surfaces formed of the material having the characteristic same as or similar to the characteristic of the coating film 24.

In this embodiment, the openings of the holes 221 and 231 on the internal space S side are formed in the window sections 22 and 23. Consequently, it is easy to seal the holes 221 and 231 with the sealing materials 251 and 252 and arrange the coating members 261 and 262 in the holes 221 and 231.

Specifically, in this embodiment, the coating member 261 includes a base material 261a and a coating layer 261b provided on the surface of the base material 261a. Similarly, the coating member 262 includes a base material 262a and a coating layer 262b provided on the surface of the base material 262a.

The base materials 261a and 262a are formed in a spherical shape. Consequently, the entire coating members 261 and 262 are also formed in a spherical shape. The coating members 261 and 262 can be efficiently arranged to be closely attached to the inner wall surfaces of the holes 221 and 231 formed in the circular cross sectional shape explained above. Note that the shape of the base materials 261a and 262a or the coating members 261 and 262 is determined according to the shape of the holes 221 and 231, the shape of the inner wall surface of the internal space S, and the like and is not limited to the spherical shape. For example, in this embodiment, the shape may be a columnar shape, a truncated cone shape, or the like. That is, as explained above, from the viewpoint of efficiently arranging the coating members 261 and 262 in the holes 221 and 231, when viewed on the cross sections of the holes 221 and 231, the base materials 261a and 262a are preferably formed in a shape same as or similar to the cross sectional shape of the holes 221 and 231. Surfaces of the base materials 261a and 262a facing the inside of the internal space S from the holes 221 and 231 of the coating members 261 and 262 are preferably formed in a shape flush with the surface of the coating film 24 as much as possible.

Note that the surfaces of the coating members 261 and 262 are respectively spherical surfaces. Therefore, a slight gap is formed between the surfaces and the opening end portions of the holes 221 and 231 on the internal space S side. However, the inventor has confirmed that the gap does not affect the behavior of the alkali metal if the gap is equal to or smaller than 50 µm. Therefore, the gap is preferably equal to or smaller than 50 µm.

The diameter (the width) of the base materials 261a and 262a is set such that the diameter (the width) of the coating members 261 and 262 is larger than the opening diameter of the holes 221 and 231 on the internal space S side. Consequently, the coating members 261 and 262 can be retained and arranged in the holes 221 and 231 before the sealing by the sealing materials 251 and 252. After the sealing by the sealing materials 251 and 252, even if the coating members 261 and 262 are not joined and fixed to the sealing materials 251 and 252, it is possible to prevent the coating members 261 and 262 from separating to the internal space S side.

The constituent material of the base materials 261a and 262a is not particularly limited. A metal material, a ceramic material, a silicon material, a glass material, a resin material, and the like can be used. The constituent material of the base materials 261a and 262a may be the same as the constituent material of the coating layers 261b and 262b (i.e., the entire coating members 261 and 262 may be formed of a coating material). However, the constituent material of the base materials 261a and 262a is preferably different from the constituent material of the coating layers 261b and 262b. Consequently, by selecting the constituent material of the base materials 261a and 262a as appropriate, it is possible to give a characteristic different from the characteristic of the coating material to the coating members 261 and 262.

For example, as the constituent material of the base materials 261a and 262a, a material having a melting point higher than the melting point of the sealing materials 251 and 252 is preferably used. Consequently, it is possible to prevent or reduce deformation of the coating members 261 and 262 due to heat during the sealing of the sealing materials 251 and 252.

As the constituent material of the base materials 261a and 262a, a material having relatively low thermal conductivity, specifically, a non-metal material such as a ceramic material, a silicon material, a glass material, or a resin material is preferably used. In particular, from the viewpoint that a melting point of the base materials 261a and 262a can be set higher than the melting point of the sealing materials 251 and 252 explained above, the ceramic material, the silicon material, or the glass material is more preferably used. Consequently, since the base materials 261a and 262a also function as heat insulating materials, it is possible to prevent or reduce melting of portions of the coating layers 261b and 262b on the internal space S side due to heat during the sealing by the sealing materials 251 and 252.

As the coating material forming the coating layers 261b and 262b provided on the base materials 261a and 262a, a material same as the constituent material of the coating film 24 explained below can be used. However, the coating material is preferably fluorine-based resin, a siloxane-based compound, or chain saturated hydrocarbon. If the coating material includes at least one of the materials, it is possible to effectively reduce a change in the behavior of alkali atoms when the alkali atoms collide against the coating materials 261 and 262. The coating materials 261 and 262 are excellent in chemical stability. It is possible to set the boiling point of the coating materials higher than the boiling point of metal atoms.

The thickness of the coating layers 261b and 262b is not particularly limited. However, the thickness of the coating layers 261b and 262b is preferably approximately the same as the thickness of the coating film 24, specifically, equal to or larger than 0.8 times or equal to or smaller than 1.2 times as large as the thickness of the coating film. 24 such that the action of the coating layers 261b and 262b on the alkali metal is approximately the same as the action of the coating film 24.

The sealing materials 251 and 252 are arranged on the opposite side (the outer side) of the internal space S with respect to the coating members 261 and 262 in the holes 221 and 231 and seal the holes 221 and 231 (seal the internal space S). Consequently, it is possible to provide, near the openings of the holes 221 and 231 on the internal space S side, surfaces formed of the material (the coating material) having a characteristic same as or similar to the characteristic of the coating film 24 and seal the holes 221 and 231.

The constituent material of the sealing materials 251 and 252 is not particularly limited. For example, metal such as silver solder, an Au/Sn alloy, and an Au/Ge alloy and glass such as vanadium-based (V—P—O) low-melting point glass, bismuth-based (bi-B—O) low-melting point glass, and lead-based (Pb—B—O) low-melting point glass can be used. Above all, the glass (in particular, low-melting point glass) is preferably used. Since the sealing materials 251 and 252 are formed including such glass, it is possible to melt the sealing materials 251 and 252 at a relatively low temperature and seal the holes 221 and 231. Therefore, it is possible to prevent or reduce melting of the coating material of the coating members 261 and 262 due to heat during the sealing. It is possible to easily and surely provide, near the openings of the holes 221 and 231 on the internal space S side, the surfaces formed of the material having the characteristic same as or similar to the characteristic of the coating film 24.

With the gas cell 2 explained above, the coating film 24 is formed on the inner wall surface of the internal space S. Further, the surfaces (the coating layers 261b and 262b) formed of the coating material having the characteristic same as or similar to the characteristic of the coating film 24 are provided near the openings of the holes 221 and 231 on the internal space S side. Therefore, it is possible to stabilize the behavior of the alkali metal in the internal space S and, as a result, improve frequency stability.

The temperature of the gas cell 2 is adjusted to, for example, approximately 70° C. by the heater 6.

Light Source

The light emitting unit 3 (a light source) has a function of emitting the excitation light LL for exciting the alkali metal in the gas cell 2.

More specifically, the light emitting unit 3 emits, as the excitation light LL, the two kinds of light (the resonance light 1 and the resonance light 2) having the different frequencies explained above.

The resonance light 1 can excite the alkali metal in the gas cell 2 from the ground state 1 to the excited state. On the other hand, the resonance light 2 can excite the alkali metal in the gas cell 2 from the ground state 2 to the excited state.

The light emitting unit 3 is not particularly limited as long as the light emitting unit 3 can emit the excitation light. However, for example, a semiconductor laser such as a vertical resonator surface light emitting laser (VCSEL) can be used.

The light emitting unit 3 is connected to an excitation-light control unit 12 of a control unit 10 explained below and is controlled to be driven on the basis of a detection result of the light detecting unit 5 (see FIG. 1).

The temperature of the light emitting unit 3 is adjusted to a predetermined temperature by a not-shown temperature adjustment element (a heating resistor, a Peltier element, etc.).

Optical Components

The plurality of optical components 41, 42, 43, and 44 are provided on an optical path of the excitation light LL between the light emitting unit 3 and the gas cell 2.

The optical component 41, the optical component 42, the optical component 43, and the optical component 44 are arranged in this order from the light emitting unit 3 side to the gas cell 2 side.

The optical component 41 is a lens. Consequently, it is possible to irradiate the excitation light LL on the gas cell 2 without waste.

The optical component 41 has a function of converting the excitation light LL into parallel light. Consequently, it is possible to easily and surely prevent the excitation light LL from reflecting on the inner wall of the gas cell 2. Therefore, it is possible to suitably cause resonance of the excitation light LL in the gas cell 2 and, as a result, improve the oscillation characteristic of the atomic oscillator 1.

The optical component 42 is a polarizing plate. Consequently, it is possible to adjust polarization of the excitation light LL from the light emitting unit 3 to a predetermined direction.

The optical component 43 is a dimming filer (an ND filter). Consequently, it is possible to adjust (reduce) the intensity of the excitation light LL made incident on the gas cell 2. Therefore, even when an output of the light emitting unit 3 is large, it is possible to set the excitation light LL made incident on the gas cell 2 to a desired light amount. In this embodiment, the intensity of the excitation light LL having the polarization in the predetermined direction, which has passed through the optical component 42, is adjusted by the optical component 43.

The optical component 44 is a $\lambda/4$ wavelength plate. Consequently, it is possible to convert the excitation light LL from the light emitting unit 3 from linearly polarized light into circularly polarized light (right circularly polarized light or left circularly polarized light).

In a state in which alkali metal atoms in the gas cell 2 are Zeeman-split by a magnetic field of the magnetic-field generating unit 8 as explained below, if excitation light of linearly polarized light is irradiated on the alkali metal atoms, the alkali metal atoms are equally distributedly present in a plurality of levels of the Zeeman-split alkali metal atoms according to mutual action of the excitation light and the alkali metal atoms. As a result, the number of the alkali metal atoms of a desired energy level becomes relatively small with respect to the number of the alkali metal atoms of the other energy levels. Therefore, the number of atoms that develop a desired EIT phenomenon decreases and the intensity of a desired EIT signal decreases. As a result, the oscillation characteristic of the atomic oscillator 1 is deteriorated.

On the other hand, in the state in which the alkali metal atoms in the gas cell 2 are Zeeman-split by the magnetic field of the magnetic-field generating unit 8 as explained below, when excitation light of circularly polarized light is irradiated on the alkali metal atoms, among the plurality of levels of the Zeeman-split alkali metal atoms, the number of the alkali metal atoms of the desired energy level can be set relatively large with respect to the number of the alkali metal atoms of the other energy levels according to mutual action of the excitation light and the alkali metal atoms. Therefore, the number of atoms that develops the desired EIT phenomenon increases and the intensity of the desired EIT signal increases. As a result, it is possible to improve the oscillation characteristic of the atomic oscillator 1.

Light Detecting Unit

The light detecting unit 5 has a function of detecting the intensity of the excitation light LL (the resonance lights 1 and 2) transmitted through the gas cell 2.

The light detecting unit 5 is not particularly limited as long as the light detecting unit 5 can detect the excitation light. However, for example, a solar cell and a photodetector (a light receiving element) such as a photodiode can be used.

The light detecting unit 5 is connected to an excitation-light control unit 12 of the control unit 10 explained below (see FIG. 1).

Heater

The heater 6 (a heating unit) has a function of heating the gas cell 2 (more specifically, the alkali metal in the gas cell 2). Consequently, it is possible to maintain the alkali metal in the gas cell 2 in a gaseous state of appropriate concentration.

The heater 6 generates heat with energization (direct current). For example, although not shown in the figure, the heater 6 is configured by two heating resistors provided on the outer surface of the gas cell 2.

One heating resistor is provided in the window section 22 (the incident side window section) of the gas cell 2. The other heating resistor is provided in the window section 23 (the emission side window section) of the gas cell 2. By arranging the heating resistors in the respective window sections 22 and 23, it is possible to prevent the alkali metal atoms from being dew-condensed in the window sections 22 and 23 of the gas cell 2. As a result, it is possible to maintain an excellent characteristic (oscillation characteristic) of the atomic oscillator 1 for a long period.

The heating resistors are formed of a material having transparency to excitation light, specifically, a transparent electrode material of, for example, an oxide such as ITO (Indium Tin Oxide), IZO (Indium Zinc Oxide), $In_3O_3$, $SnO_2$, Sb containing $SnO_2$, or Al containing ZnO.

The heating resistors can be formed using, for example, chemical vapor deposition methods (CVD) such as plasma CVD and thermal CVD, a dry plating method such as vacuum evaporation, and a sol-gel method.

Note that the heater 6 is not limited to the form explained above as long as the heater 6 can heat the gas cell 2. Various heaters can be used. The heater 6 may be in non-contact with the gas cell 2. The gas cell 2 may be heated using a Peltier element instead of the heater 6 or together with the heater 6.

The heater 6 is electrically connected to a temperature control unit 11 of the control unit 10 explained below and energized (see FIG. 1).

Temperature Sensor

The temperature sensor 7 detects the temperature of the heater 6 or the gas cell 2. A heat value of the heater 6 is controlled on the basis of a detection result of the temperature sensor 7. Consequently, it is possible to maintain the alkali metal atoms in the gas cell 2 at desired temperature.

Note that the setting position of the temperature sensor 7 is not particularly limited. The temperature sensor 7 may be set on the heater 6 or may be set on the outer surface of the gas cell 2.

The temperature sensor 7 is not particularly limited. Various publicly-known temperature sensors such as a thermistor and a thermocouple can be used.

The temperature sensor 7 is electrically connected to a temperature control unit 11 of the control unit 10 explained below via a not-shown wire (see FIG. 1).

Magnetic-Field Generating Unit

The magnetic-field generating unit 8 has a function of generating a magnetic field for Zeeman-splitting a degenerated plurality of energy levels of the alkali metals in the gas cell 2. Consequently, it is possible to expand, with the Zeeman splitting, a gap between degenerated different energy levels of the alkali metal and improve resolution. As a result, it is possible to increase accuracy of the oscillation frequency of the atomic oscillator 1.

The magnetic-field generating unit 8 is configured by a Helmholtz coil arranged to sandwich the gas cell 2 or a solenoid coil arranged to cover the gas cell 2. Consequently, it is possible to generate a uniform magnetic field in one direction in the gas cell 2.

The magnetic field generated by the magnetic-field generating unit 8 is a constant magnetic field (a direct-current magnetic field). However, an alternating-current magnetic field may be superimposed on the magnetic field.

The magnetic-field generating unit 8 is electrically connected to a magnetic-field control unit 13 of the control unit 10 explained below and subjected to energization control (see FIG. 1).

Control Unit

The control unit 10 shown in FIG. 1 has a function of controlling the light emitting unit 3, the heater 6, and the magnetic-field generating unit 8.

The control unit 10 includes an excitation-light control unit 12 that controls the frequencies of the resonance lights 1 and 2 of the light emitting unit 3, a temperature control unit 11 that controls the temperature of the alkali metal in the gas cell 2, and a magnetic-field control unit 13 that controls a magnetic field generated from the magnetic-field generating unit 8.

The excitation-light control unit 12 controls, on the basis of a detection result of the light detecting unit 5, the frequencies of the resonance lights 1 and 2 emitted from the light emitting unit 3. More specifically, the excitation-light control unit 12 controls the frequencies of the resonance lights 1 and 2 emitted from the light emitting unit 3 such that ($\omega 1 - \omega 2$) detected by the light detecting unit 5 is the frequency $\omega 0$ peculiar to the alkali metal. The excitation-light control unit 12 controls a center frequency of the resonance lights 1 and 2 emitted from the light emitting unit 3.

Although not shown in the figure, the excitation-light control unit 12 includes a voltage control type quartz oscillator (oscillation circuit). The excitation-light control unit 12 outputs an oscillation frequency of the voltage control type quartz oscillator as an output signal of the atomic oscillator 1 while synchronizing and adjusting the oscillation frequency on the basis of the detection result of the light detecting unit 5.

The temperature control unit 11 controls energization to the heater 6 on the basis of the detection result of the temperature sensor 7. Consequently, it is possible to maintain the gas cell 2 within a desired temperature range.

The magnetic-field control unit 13 controls energization to the magnetic-field generating unit 8 such that the magnetic field generated by the magnetic-field generating unit 8 is fixed.

The control unit 10 is provided in, for example, an IC chip mounted on a substrate.

With the atomic oscillator 1 configured as explained above, the uniform coating film 24 is formed on the inner wall surface of the gas cell 2. Therefore, even if the gas cell 2 is reduced in size, it is possible to suppress a change in the behavior of the alkali metal due to collision of the alkali metal against the inner wall surface of the gas cell 2 from adversely affecting a characteristic (an oscillation characteristic). Therefore, it is possible to configure the atomic oscillator 1 as a small atomic oscillator having excellent frequency stability and excellent reliability.

The gas cell 2 included in the atomic oscillator 1 can be manufactured by a manufacturing method explained below.
Manufacturing Method for an Atomic Cell in the First Embodiment As an example of a manufacturing method for an atomic cell according to the invention, a manufacturing method for the gas cell 2 is explained below.

Figure 6:
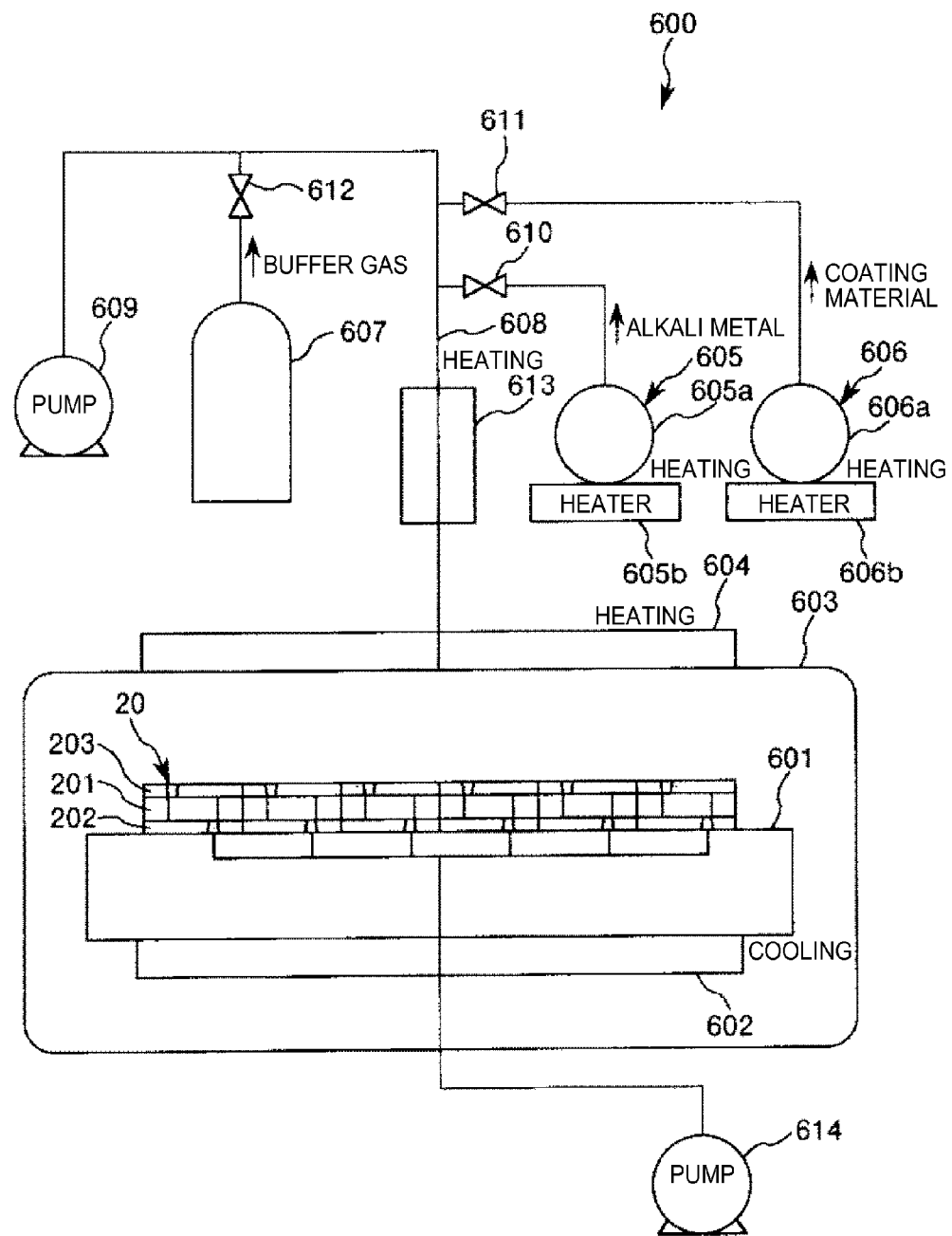
FIG. 6 is a schematic diagram of an apparatus used for feeding metal atoms and a coating material in manufacturing of the gas cell shown in FIG. 5.
Figure 7A:
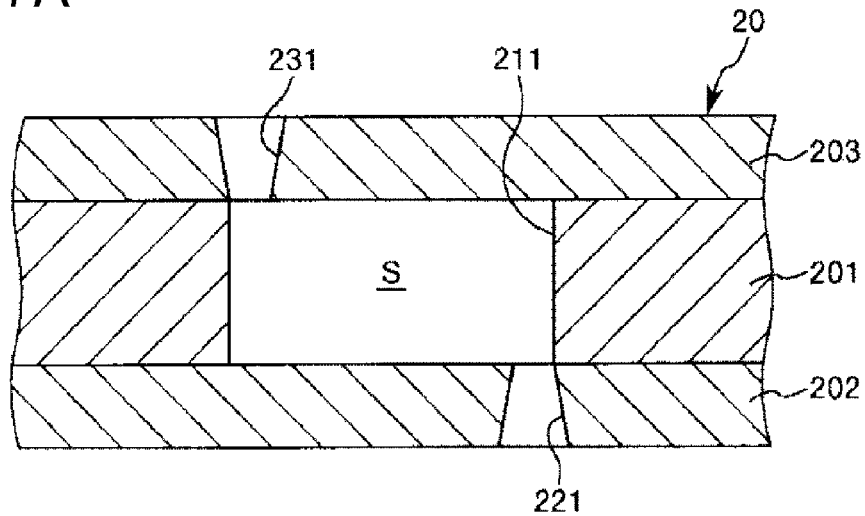
FIGS. 7A to 7C are diagrams for explaining a manufacturing method (a coating material feeding step) for the gas cell shown in FIG. 5.
Figure 7B:
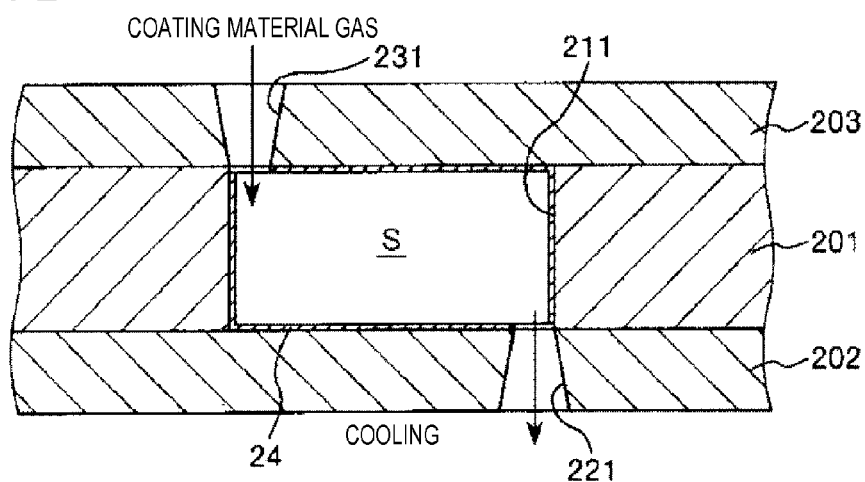
Figure 7C:
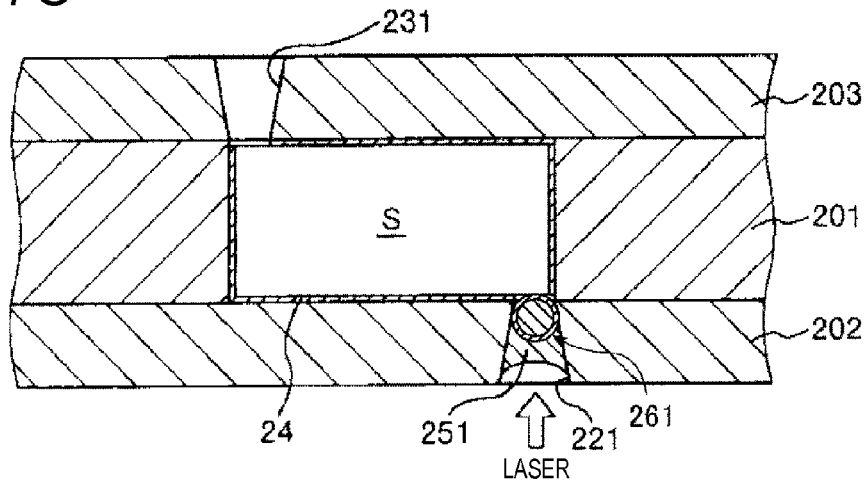
Figure 8A:
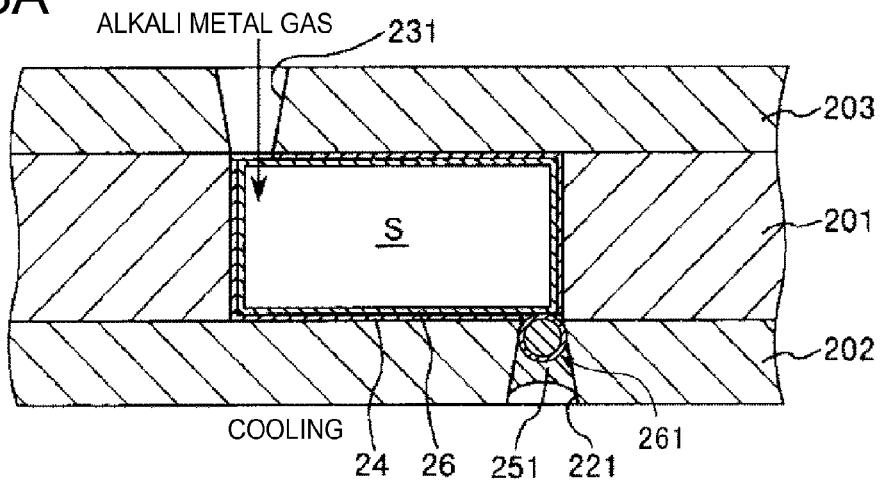
FIGS. 8A to 8C are diagrams for explaining the manufacturing method (a metal atom feeding step) for the gas cell shown in FIG. 5.
Figure 8B:
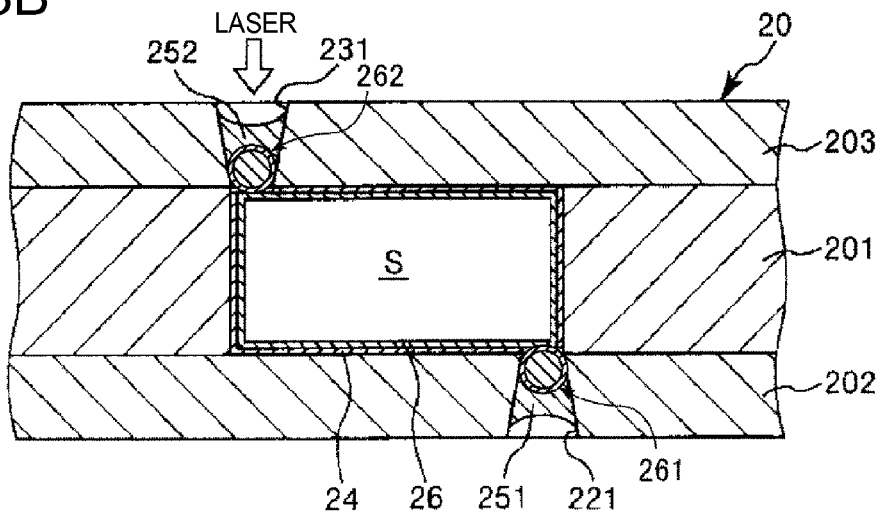
Figure 8C:
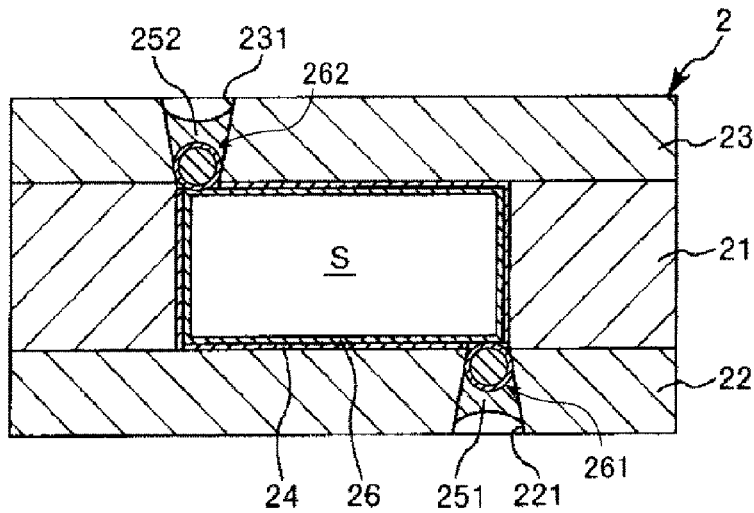
Figure 9A:
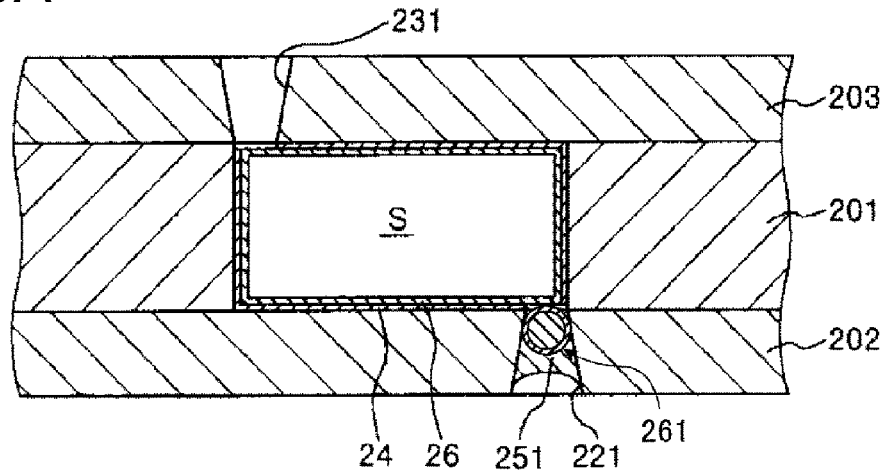
FIGS. 9A to 9C are diagrams for explaining a sealing process shown in FIG. 8B.
Figure 9B:
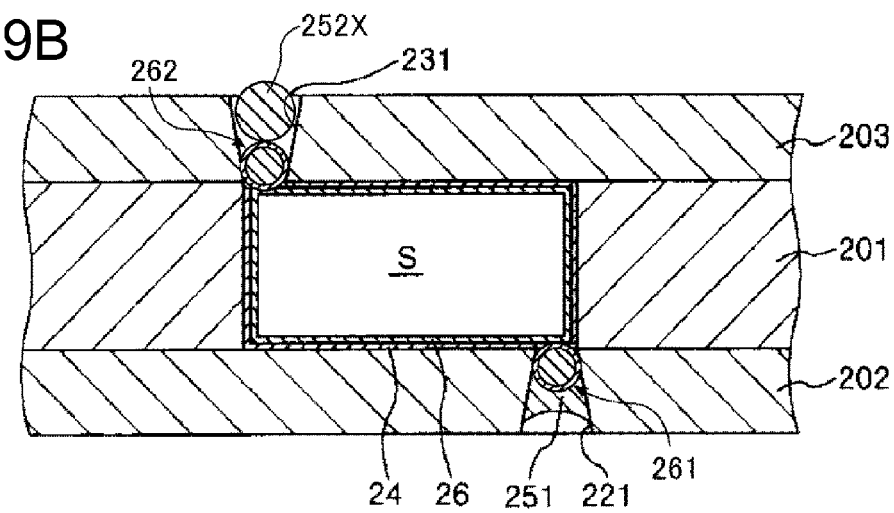
Figure 9C:
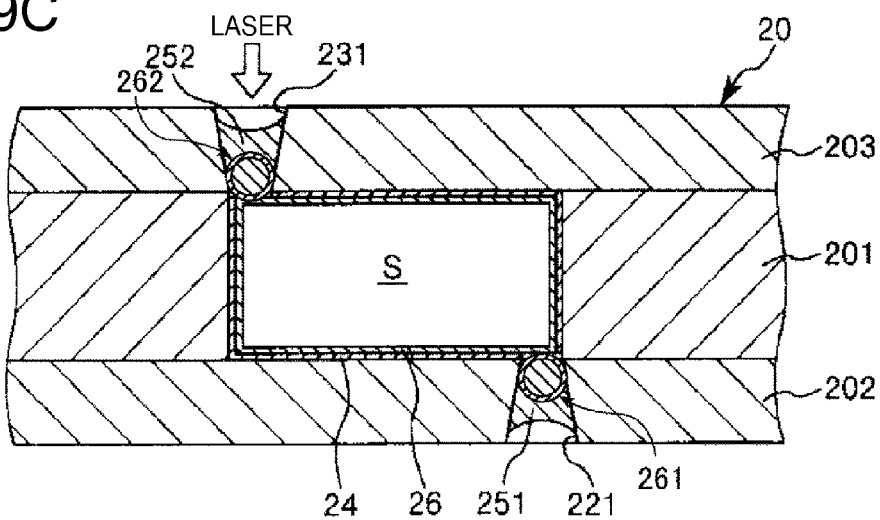

FIG. 6 is a schematic diagram of an apparatus used for feeding metal atoms and a coating material in manufacturing of the gas cell shown in FIG. 5. FIGS. 7A to 7C are diagrams for explaining a manufacturing method (a coating material feeding step) for the gas cell shown in FIG. 5. FIGS. 8A to 8C are diagrams for explaining the manufacturing method (a metal atom feeding step) for the gas cell shown in FIG. 5. FIGS. 9A to 9C are diagrams for explaining a sealing process shown in FIG. 8B.

The manufacturing method for the gas cell 2 includes [1A] a preparation process for preparing the structure 20 including the internal space S and the holes 221 and 231, [1B] a feeding process for feeding alkali metal and a coating material into the internal space S through the hole 231, and [1C] a sealing process for sealing the hole 231 with the sealing material 252.

In the feeding process [1B], the alkali metal and the coating material are fed into the internal space S through the hole 231 using an apparatus 600 shown in FIG. 6. Note that the apparatus 600 is explained in detail below in explanation of the feeding process [1B].

The processes [1A], [1B], and [1C] are sequentially explained below.
[1A]

First, as shown in FIG. 7A, the structure 20 including a plurality of sets of the internal space S and the holes 221 and 231 is prepared.

The structure 20 is configured by a substrate 201 including a through-hole 211, a substrate 202 including a hole 221, and a substrate 203 including the hole 231.

The substrate 201 is singulated in a singulation process explained below to be the body section 21.

The substrate 202 is joined to one surface of the substrate 201 and singulated in the singulation process to be the window section 22.

The substrate 203 is joined to the other surface of the substrate 201 and singulated in the singulation process to be the window section 23.

The substrate 201 is formed of a constituent material same as the constituent material of the body section 21. The substrates 202 and 203 are formed of a constituent material same as the constituent material of the window sections 22 and 23. The substrate 201 and the substrates 202 and 203 are joined by a joining method same as the joining of the body section 21 and the window sections 22 and 23.

When the substrate 201 and the substrates 202 and 203 are heated and joined, that is, when the preparation process [1A] includes a step of manufacturing the structure 20 using a heating joining method, in the structure 20, the entire internal space S is exposed to high temperature during heating and joining. Therefore, even if coating is applied to a part to be formed as the wall surface of the internal space S before the heating and joining, the coating is melted by high temperature during the heating and joining. In particular, in the anodic joining method, temperature during joining is extremely high. Therefore, when the substrate 201 and the substrates 202 and 203 are joined by the anodic joining method, if it is attempted to perform the coating before the anodic joining, it is difficult to select a coating material. Therefore, after the heating and joining, the coating (formation of the coating film 24) is performed in the feeding process [1B]. Therefore, the coating film 24 is not melted by heat of the heating and joining.

The structure 20 is prepared as explained above. Although not shown in the figure, in the process [1A], a protection film for preventing adhesion of the alkali metal and the coating material in the process [1B] is formed on surfaces of the substrates 202 and 203 on the opposite side of the substrate 201 according to necessity. The protection film is formed of, for example, a resin film and removed after the process [1B] or the process [1C]. Note that, when a pipe for feeding the alkali metal and the coating material is directly connected to the hole 231 in the process [1B], the protection film is unnecessary.
[1B]

Subsequently, the alkali metal and the coating material are fed into the internal space S through the hole 231.

Specifically, the feeding process [1B] includes <1B-1> a coating material feeding step for feeding the coating material into the internal space S and <1B-2> a metal atom feeding step for feeding the alkali metal into the internal space S.

In the steps <1B-1> and <1B-2>, that is, for the feeding of the metal atoms and the coating material into the internal space S, for example, the apparatus 600 shown in FIG. 6 is used.

The apparatus 600 includes, as shown in FIG. 6, a stage 601, a cooling unit 602 provided in the stage 601, a chamber 603 that houses the stage 601 and the cooling section 602, a metal supplying unit 605 connected to the chamber 603, a coating-material supplying unit 606, a buffer-gas supplying unit 607, and a pump 609.

The structure 20 is placed on the stage 601. The structure 20 is placed on the stage 601 such that the surface of the structure 20 on the substrate 202 side is in contact with the stage 601.

The stage 601 is cooled by the cooling unit 602. Consequently, it is possible to cool the structure 20 placed on the stage 601.

The cooling unit 602 is not particularly limited as long as the cooling unit 602 can cool the stage 601 and the structure 20. However, the cooling unit 602 can be configured by, for example, a Peltier element and a cooling pipe through which a cooling medium circulates.

In the stage 601, a hole (not shown in the figure) opened on a surface on which the structure 20 is placed is formed. The hole is provided to correspond to the hole 221 of the structure 20 placed on the stage 601 and connected to the pump 614 (e.g., a vacuum pump such as a rotary pump or a diffusion pump). Consequently, gas in the internal space S can be discharged via the hole 221. The internal space S can be changed to a negative pressure state. The structure 20 may be attracted to the stage 601 using negative pressure generated by the pump 614.

In the chamber 603 that houses the stage 601 together with the structure 20, a heater 604 is provided. Consequently, it is possible to set the atmospheric temperature in the chamber 603 higher than the temperature of the structure 20. Therefore, it is possible to set the temperature in the chamber 603 to temperature equal to or higher than the boiling points of the alkali metal and the coating material. It is possible to feed the alkali metal and the coating material in a gaseous state, which have flowed into the chamber 603, into the internal space S while keeping the gaseous state.

The metal supplying unit 605, the coating-material supplying unit 606, the buffer-gas supplying unit 607, and the pump 609 are connected to the chamber 603 via a pipe 608.

The metal supplying unit 605 has a function of supplying the gaseous alkali metal to the chamber 603. The metal supplying unit 605 includes a container 605a that stores the alkali metal and a heater 605b that heats the container 605a. The metal supplying unit 605 gasifies metal in the container 605a with heat from the heater 605b.

The metal supplying unit 605 is connected to the pipe 608 via a valve 610.

The coating-material supplying unit 606 has a function of supplying the gaseous coating material into the chamber 603. The coating-material supplying unit 606 includes a container 606a that stores the coating material and a heater 606b that heats the container 606a. The coating-material supplying unit 606 gasifies metal in the container 606a with heat from the heater 606b.

The coating-material supplying unit 606 is connected to the pipe 608 via a valve 611.

The buffer-gas supplying unit 607 has a function of supplying a buffer gas into the chamber 603. The buffer-gas supplying unit 607 is, for example, a cylinder filled with the buffer gas.

The buffer-gas supplying unit 607 is connected to the pipe 608 via a valve 612.

The pump 609 has a function of decompressing the chamber 603. The pump 609 is, for example, a vacuum pump such as a rotary pump or a diffusion pump. The pump 609 is connected to the pipe 608.

In the pipe 608, a heater 613 is provided. Consequently, it is possible to heat the pipe 608 and prevent the alkali metal and the coating material circulating in the pipe 608 from liquefying and solidifying.

The coating material feeding step <1B-1> and the metal atom feeding step <1B-2> are performed as explained below using the apparatus 600 configured as explained above.
<1B-1>

First, the structure 20 is placed on the stage 601. The pump 614 is actuated while the valves 610 and 612 are changed to a closed state and the valve 611 is changed to an open state.

Consequently, as shown in FIG. 7B, the gaseous coating material (a coating material gas) is fed into the internal space S via the hole 231. In this embodiment, the coating material is fed into the internal space S via the hole 231 while being sucked from the hole 221. Therefore, it is possible to supply a desired amount of the coating material into the internal space S and discharge an unnecessary excess coating material from the hole 231.

In this case, the wall surface of the internal space S is cooled by the cooling unit 602. The temperature of the wall surface is preferably lower than the boiling point of the coating material (more preferably lower than the melting point of the coating material).

In this way, in a state in which the temperature of the wall surface of the internal space S is set lower than the boiling point of the coating material (more preferably lower than the melting point of the coating material), the gaseous coating material is fed into the internal space S, whereby the gaseous coating material coagulates or solidifies on the wall surface of the internal space S to be the coating film 24. Consequently, it is possible to efficiently perform coating on the wall surface of the internal space S.

The melting point of the coating material is preferably higher than the boiling point of the alkali metal fed into the internal space S in the step <1B-2> explained below. Consequently, in the metal atom feeding step <1B-2>, it is possible to prevent the coating material or the coating film from melting.

The coating material is not particularly limited as long as the coating film 24 having the function explained above can be formed. However, the coating material is preferably a compound of any one of fluorine-based resin, a siloxane-based compound, and chain saturated hydrocarbon or a precursor of the compound.

The coating film 24 obtained by such a compound can effectively reduce a change in the behavior of the alkali metal when the alkali metal collides against the coating film 24. The coating film 24 is excellent in chemical stability. It is possible to set the boiling point of the coating material higher than the boiling point of the metal atoms.

Examples of the fluorine-based resin used as the coating material include polytetrafluoroethylene (PTFE), polychlorotrifluoroethylene (PCTFE), polyvinylidene fluoride (PVDF), polyvinyl fluoride (PVF), perfluoroalkoxyfluororesin (PFA), tetrafluoroethylene/propylene hexafluoride copolymer (FEP), ethylene/tetrafluoroethylene copolymer (ETFE), and ethylene/chlorotrifluoroethylene copolymer (ECTFE).

Examples of the siloxane-based compound used as the coating material include alkoxysilane such as methyltrimethoxysilane, dimethyldimethoxysilane, phenyltrimethoxysilane, methyltriethoxysilane, dimethyldiethoxysilane, phenyltriethoxysilane, hexyltrimethoxysilane, hexyltriethoxysilane, decyltrimethoxisilane, and trifluoropropyltrimethoxysilane, silazane such as hexamethylsilazane, and siloxane such as hydrolysable group containing siloxane.

Examples of the chain saturated hydrocarbon used as the coating material include paraffin (alkane having twenty or more carbon atoms).

When the coating material is the precursor of the constituent material of the coating film 24, the coating material coagulated or solidified on the wall surface of the internal space S is caused to react by, for example, heating according to necessity.

According to the step <1B-1> explained above, the coating material is fed into the internal space S to form the coating film 24 on the wall surface of the internal space S.

In this embodiment, after the step <1B-1> and before the step <1B-2>, as shown in FIG. 7C, the coating member 261 is arranged in the hole 221 and the hole 221 is sealed by the sealing material 251. The sealing material 251 is formed by, for example, arranging a ball-like sealing material in the hole 221 and melting the sealing material with an energy beam such as a laser or an ion beam. Note that a sealing method for the hole 221 by the sealing material 251 is the same as a sealing method for the hole 231 by the sealing material 252 explained in detail below.

Note that a step for sealing the hole 221 with the sealing material 251 may be performed after the step <1B-2>. In this case, in the step <1B-2>, as in the step <1B-1>, the alkali metal only has to be fed into the internal space S via the hole 231 while being sucked from the hole 221.

<1B-2>

Subsequently, the pump 609 is actuated while the valves 610, 611, and 612 are changed to the closed state. Consequently, the chamber 603 and the internal space S are decompressed.

Thereafter, the pump 609 is stopped. The valve 610 is changed to the open state while the valves 611 and 612 are kept in the closed state.

Consequently, as shown in FIG. 8A, the gaseous alkali metal (an alkali metal gas) is fed into the internal space S via the hole 231.

The feeding of the alkali metal into the internal space S is performed under conditions (temperature and pressure) for not melting the coating film 24.

In particular, the feeding of the alkali metal into the internal space S is preferably performed under a temperature condition lower than the temperature condition for the feeding of the coating material into the internal space S. That is, the metal atom feeding step <1B-2> is preferably performed under a temperature condition lower than the temperature condition in the coating material feeding step <1B-1>. More specifically, for example, the atmosphere temperature in the chamber 603 is set to temperature lower than the melting point of the coating material. Consequently, it is possible to prevent the coating film 24 from melting. Further, it is possible to prevent the metal atoms from being mixed in the coating film 24.

From such a viewpoint, as explained above, the boiling point of the alkali metal fed into the internal space S is preferably lower than the melting point of the coating film 24.

In this case, the wall surface of the internal space S is cooled by the cooling unit 602. The temperature of the wall surface is preferable lower than the boiling point of the alkali metal fed into the internal space S (more preferably lower than the melting point of the alkali metal).

In this way, in a state in which the temperature of the wall surface of the internal space S is set lower than the boiling point of the alkali metal (more preferably lower than the melting point of the alkali metal), the gaseous alkali metal is fed into the internal space S, whereby the gaseous alkali metal coagulates or solidifies on the coating film 24 to be a metal film 26.

According to the step <1B-2> explained above, the alkali metal is fed into the internal space S to form the metal film 26.

According to the feeding process [1B] explained above, since the alkali metal is fed into the internal space S after the coating material is fed into the internal space S, it is possible to prevent the alkali metal from hindering the coating. Therefore, it is possible to form a homogeneous coating film 24.

After the step <1B-2> and before the process [1C], a buffer gas is fed into the internal space S according to necessity.

More specifically, the pump 609 is actuated while the valves 610, 611, and 612 are changed to the closed state. Consequently, the chamber 603 and the internal space S are decompressed.

Thereafter, the pump 609 is stopped. The valve 612 is changed to the open state while the valves 610 and 611 are kept in the closed state.

Consequently, the buffer gas is fed into the internal space S via the hole 231. In this case, the alkali metal in the internal space S is present as the metal film 26 of a liquid state or a solid state. Therefore, it is possible to feed the buffer gas into the internal space S while keeping an amount of the alkali amount fed into the internal space S.

In this way, the feeding process [1B] includes the step of feeding the buffer gas into the internal space S after the metal atom feeding step <1B-2>. Consequently, it is possible to encapsulate the buffer gas in the internal space S together with the alkali metal while preventing the buffer gas from adversely affecting the coating.

[1C]

Subsequently, as shown in FIG. 8B, the sealing material 252 arranged after the coating member 262 is arranged in the hole 231 is melted by the energy beam to seal the hole 231. Consequently, the internal space S changes to an airtight space in which the coating film 24 is formed on the wall surface and the alkali metal is encapsulated.

More specifically, in the process [1C], as shown in FIG. 9A, the structure obtained in the process [1B] is prepared. After the coating member 262 and a sealing material 252X are arranged in the hole 231 as shown in FIG. 9B, as shown in FIG. 9C, the hole 231 is sealed by the sealing material 252.

In this case, the sealing is performed under decompression according to necessity.

As the energy beam used in the process [1C], for example, a laser, an ion beam, and the like can be used.

In this case, the sealing is performed under a condition that at least a portion on the inner space S side of the coating layer 262b of the coating member 262 does not melt.

After the sealing process [1C] explained above, the structure 20 is singulated for each set of the internal space S and the holes 221 and 231 using, for example, a dicing saw. Consequently, as shown in FIG. 8C, the gas cell 2 is obtained. In this way, a plurality of sets of the internal space S and the holes 221 and 231 are formed in the structure 20 in the preparation process [1A]. The structure 20 is singulated after the sealing process [1C]. Consequently, it is possible to efficiently manufacture a plurality of the gas cells 2.

Note that, in the gas cell 2 shown in FIG. 8C, the alkali metal encapsulated in the internal space S is present as the metal film 26 of the liquid state or the solid state. However, as explained above, when the gas cell 2 is incorporated in the atomic oscillator 1 or the like and used, a part of the metal film 26 vaporizes by being heated. The remaining part adheres to the wall surface of the internal space S while keeping the liquid state and the solid state and is present as the remainder.

The manufacturing method for the gas cell 2 explained above includes the process for preparing the structure including the internal space S and the hole 231 that allows the internal space S and the outside to communicate with each other, the alkali metal being arranged in the internal space S and the coating film 24 being formed on the wall surface of the internal space S, the process for arranging the coating member 262 and the sealing material 252X in the hole 231, and the process for melting the sealing material 252X to seal the hole 231 in a state in which the coating member 262 faces the internal space S. With such a manufacturing method, it is possible to hermetically seal the internal space S in which the alkali metal is encapsulated and obtain the gas cell 2 in which the surface formed of the coating material having the characteristic same as or similar to the characteristic of the coating film 24 is also provided near the opening of the hole 231 on the internal space S side.

Second Embodiment

A second embodiment of the invention is explained.

Figure 10:
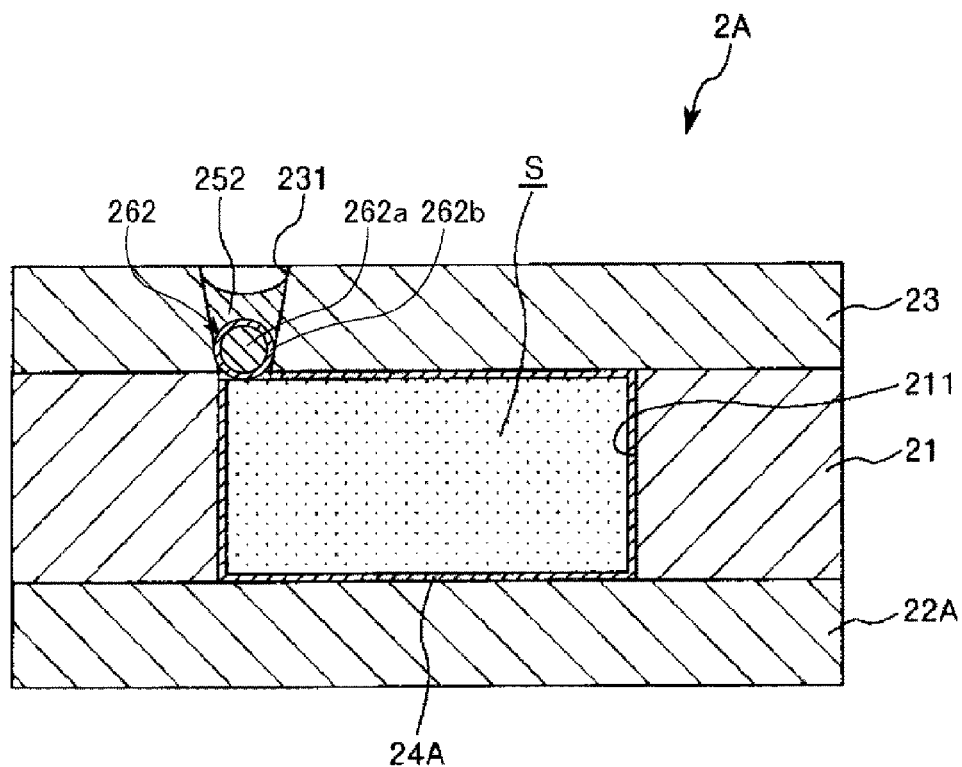
FIG. 10 is a sectional view showing a gas cell according to a second embodiment of the invention.

FIG. 10 is a sectional view showing a gas cell according to the second embodiment of the invention.

This embodiment is the same as the first embodiment except that the configuration of an atomic cell is different.

Note that, in the following explanation, concerning the second embodiment, differences from the first embodiment are mainly explained. Explanation of similarities to the first embodiment is omitted. In FIG. 10, components same as the components in the first embodiment are denoted by the same reference numerals and signs.

A gas cell 2A in this embodiment is the same as the gas cell 2 in the first embodiment except that the hole 221 in the first embodiment is omitted.

The gas cell 2A includes, instead of the window section 22 in the first embodiment, a window section 22A same as the window section 22 except that the hole 221 is omitted. Both end openings of the through-hole 211 of the body section 21 are blocked by the window sections 22A and 23, whereby the internal space S is formed. A coating film 24A is formed on the wall surface of the internal space S.

In the gas cell 2A having the configuration explained above, compared with the gas cell 2 in the first embodiment, it is possible to increase the size of a transmission area of excitation light.

Figure 11:
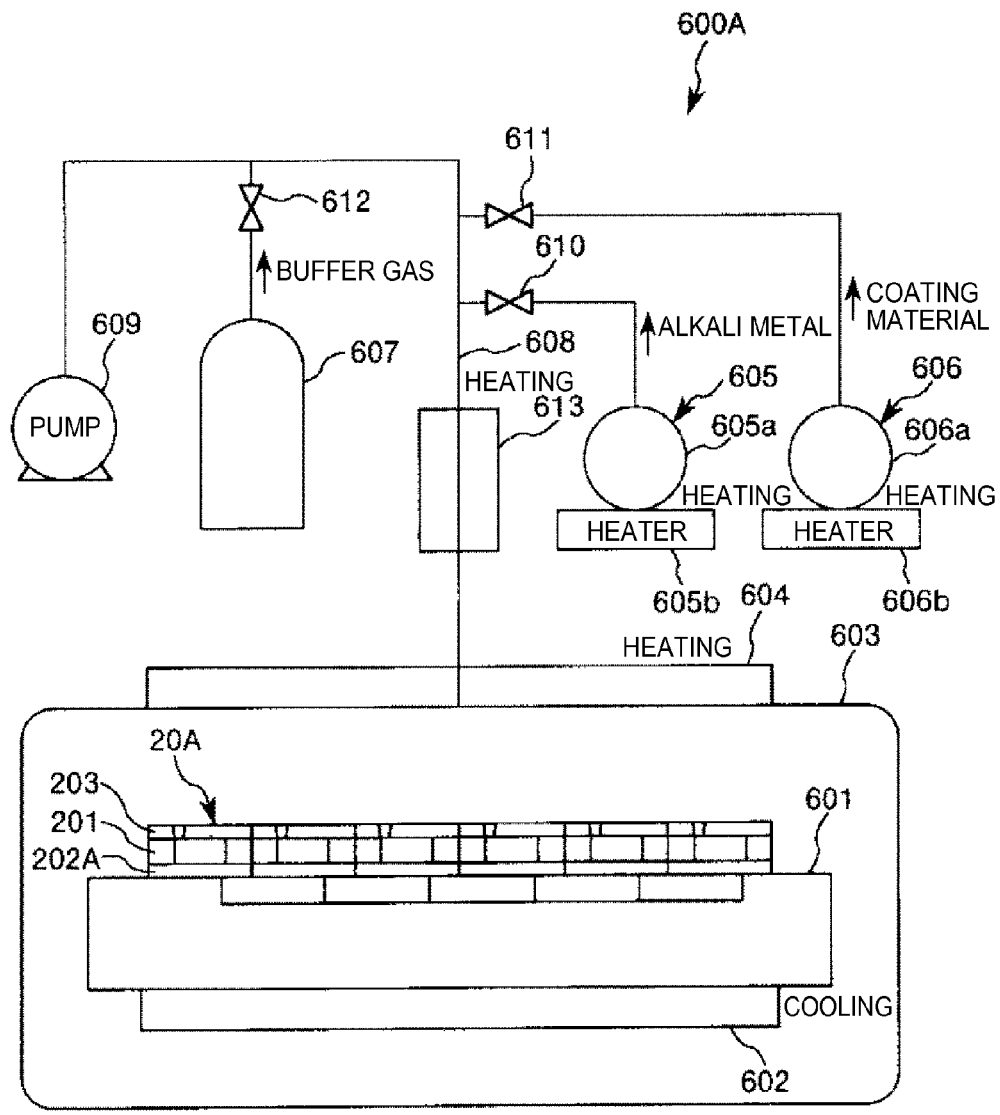
FIG. 11 is a schematic diagram of an apparatus used for feeding of metal atoms and a coating material in manufacturing of the gas cell shown in FIG. 10.
Figure 12A:
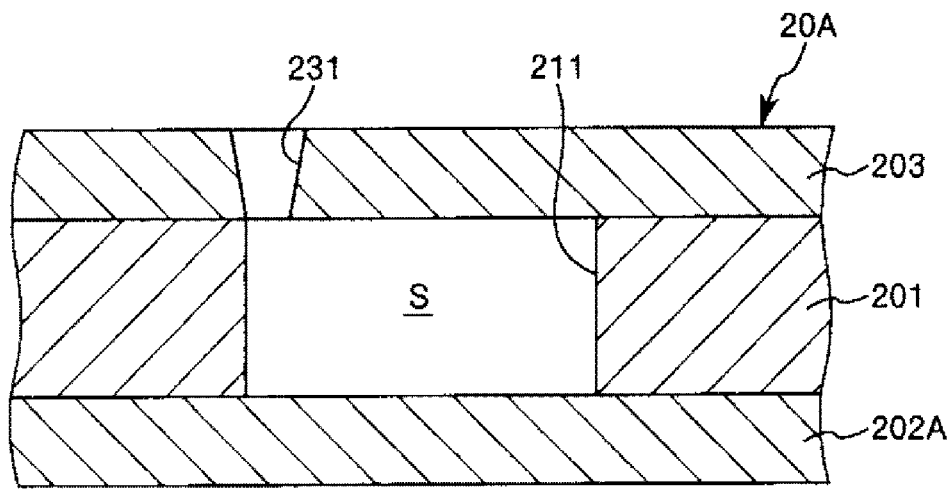
FIGS. 12A and 12B are diagrams for explaining a manufacturing method (a coating material feeding step) for the gas cell shown in FIG. 10.
Figure 12B:
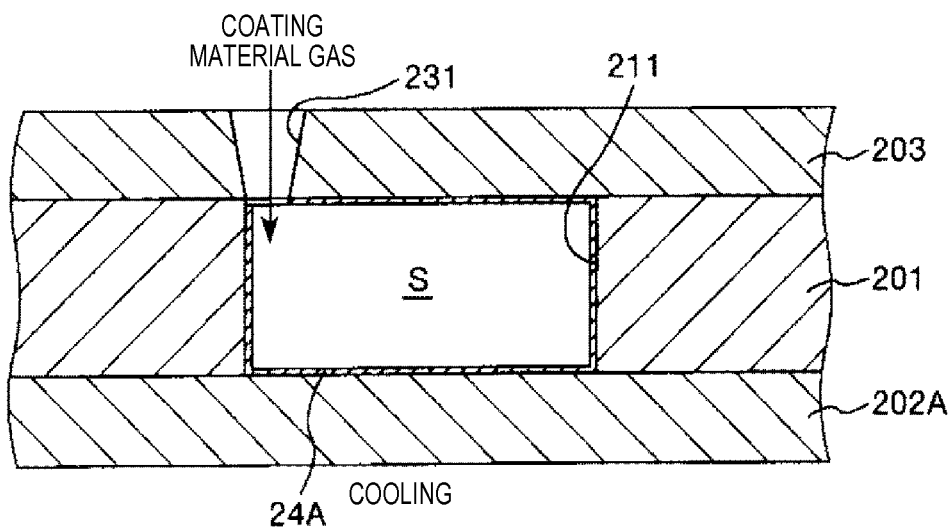
Figure 13A:
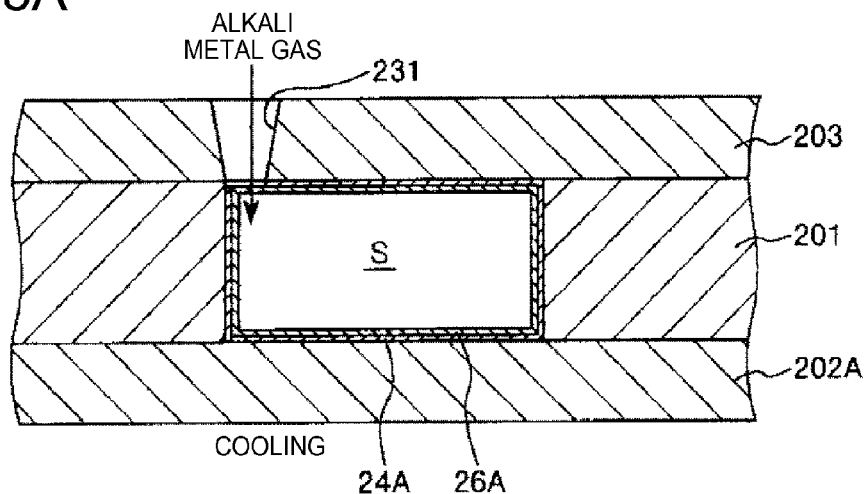
FIGS. 13A to 13C are diagrams for explaining the manufacturing method (a metal atom feeding step) for the gas cell shown in FIG. 10.
Figure 13B:
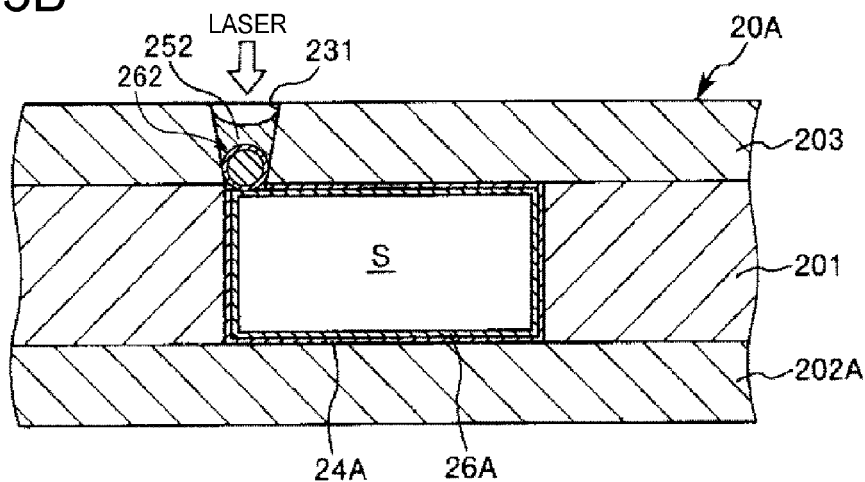
Figure 13C:
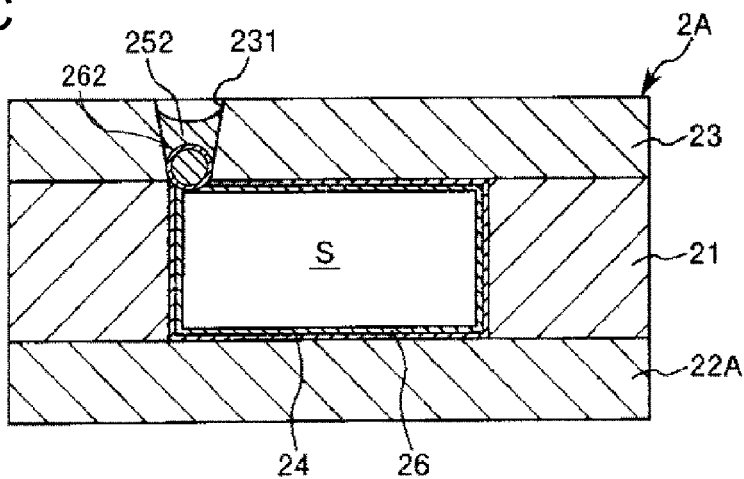

The gas cell 2A can be manufactured as explained below.
Manufacturing Method for the Atomic Cell in the Second Embodiment FIG. 11 is a schematic diagram of an apparatus used for feeding of metal atoms and a coating material in the manufacturing of the gas cell shown in FIG. 10. FIGS. 12A and 12B are diagrams for explaining a manufacturing method (a coating material feeding step) for the gas cell shown in FIG. 10. FIGS. 13A to 13C are diagrams for explaining the manufacturing method (a metal atom feeding step) for the gas cell shown in FIG. 10.

A manufacturing method for the gas cell 2A includes [2A] a preparation process for preparing a structure 20A including the internal space S and the hole 231, [2B] a feeding process for feeding alkali metal and a coating material into the internal space S through the hole 231, and [2C] a sealing process for sealing the hole 231 with the sealing material 252.

In the feeding process [2B], the alkali metal and the coating material are fed into the internal space S through the hole 231 using an apparatus 600A shown in FIG. 11. The apparatus 600A is the same as the apparatus 600 in the first embodiment except that the pump 614 is omitted.

The processes [2A], [2B], and [2C] are sequentially explained below.

[2A]

First, as shown in FIG. 12A, the structure 20A including a plurality of sets of the internal space S and the hole 231 is prepared.

The structure 20A is configured by the substrate 201 including the through-hole 211, a flat substrate 202A, and the substrate 203 including the hole 231.

The substrate 202A is singulated in a singulation process explained below to be the window section 22A.

[2B]

Subsequently, the alkali metal and the coating material are fed into the internal space S through the hole 231.

Specifically, the feeding process [2B] includes <2B-1> a coating material feeding step for feeding the coating material into the internal space S and <2B-2> a metal atom feeding step for feeding the alkali metal into the internal space S.

In the steps <2B-1> and <2B-2>, that is, for the feeding of the metal atoms and the coating material into the internal space S, for example, the apparatus 600A shown in FIG. 11 is used.

<2B-1>

First, the structure 20A is placed on the stage 601. The pump 609 is actuated while the valves 610, 611, and 612 are changed to a closed state. Consequently, the chamber 603 and the internal space S are decompressed.

Thereafter, the pump 609 is stopped. The valve 611 is changed to the open state while the valves 610 and 612 are kept in the closed state.

Consequently, as shown in FIG. 12B, the coating material in a gaseous state (a coating material gas) is fed into the internal space S via the hole 231.

According to the step <2B-1>, the coating material is fed into the internal space S to form the coating film 24A on the wall surface of the internal space S.

<2B-2>

Subsequently, as in the step <1B-2> in the first embodiment, as shown in FIG. 13A, the alkali metal in a gaseous state (an alkali metal gas) is fed into the internal space S via the hole 231.

According to the step <2B-2>, the alkali metal is fed into the internal space to form a metal film 26A.

After the step <2B-2> and before the step [2C], as in the first embodiment, a buffer gas is fed into the internal space S according to necessity.

[2C]

Subsequently, as shown in FIG. 13B, as in the process [1C] in the first embodiment, the sealing material 252 arranged after the coating member 262 is arranged in the hole 231 is melted by an energy beam to seal the hole 231.

Thereafter, the structure 20A is singulated for each set of the internal space S and the hole 231. Consequently, as shown in FIG. 13C, the gas cell 2A is obtained.

Third Embodiment

A third embodiment of the invention is explained.

Figure 14:
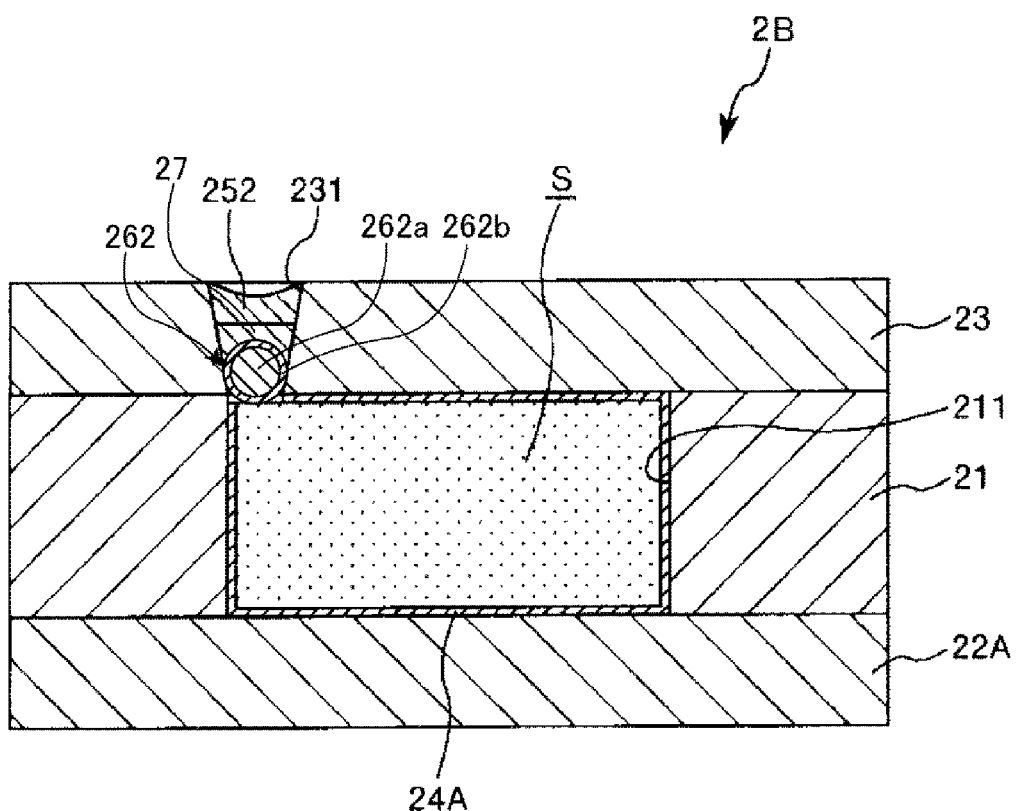
FIG. 14 is a sectional view showing a gas cell according to a third embodiment of the invention.

FIG. 14 is a sectional view showing a gas cell according to the third embodiment of the invention.

This embodiment is the same as the first embodiment except that the structure of an atomic cell is different. This embodiment is the same as the second embodiment except that a cushioning material is arranged between a sealing material and a coating member.

Note that, in the following explanation, concerning the third embodiment, differences from the embodiments explained above are mainly explained. Explanation of similarities to the embodiments is omitted. In FIG. 14, components same as the components in the embodiments are denoted by the same reference numerals and signs.

A gas cell 2B in this embodiment includes a cushioning material 27 arranged between the sealing material 252 and the coating member 262. Consequently, it is possible to prevent or reduce transfer of the heat of the sealing material 252 to the coating member 262 during sealing. Therefore, it is possible to prevent or reduce melting of the coating material of the coating member 262 due to heat during the sealing and easily and surely provide, near the opening of the hole 231 on the internal space S side, a surface (a coating layer 262b) formed of a material having a characteristic same as or similar to a characteristic of a coating film. The cushioning material 27 exhibits a function of a spacer that regulates the distance between the sealing material 252 and the coating member 262.

The constituent material of the cushioning material 27 is not particularly limited. However, the constituent material of the sealing material 252 is preferably used. In particular, a material having a melting point lower than the melting point of the sealing material 252 is preferably used. Consequently, it is possible to melt the cushioning material 27 as well to seal the hole 231 and improve airtightness. By setting the melting point of the cushioning material 27 lower than the melting point of the sealing material 252, even if the cushioning material 27 is melted, it is possible to prevent or reduce melting of the coating material of the coating member 262 due to heating of the melting.

Note that, in this embodiment, the sealing material 252 is jointed to the inner wall surface of the hole 231, the coating member 262, and the sealing material 252 by being once melted and solidified. However, the sealing material 252 may be arranged in the hole 231 without being melted. Even in this case, it is possible to cause the cushioning material 27 to function as the spacer that regulates the distance between the sealing material 252 and the coating member 262. In this case, by forming the cushioning material 27 with a material having relatively high thermal insulation such as a ceramic material or a glass material, it is possible to effectively prevent or reduce transfer of the heat of the sealing material 252 to the coating member 262 during the sealing.

Fourth Embodiment

A fourth embodiment of the invention is explained below.

Figure 15:
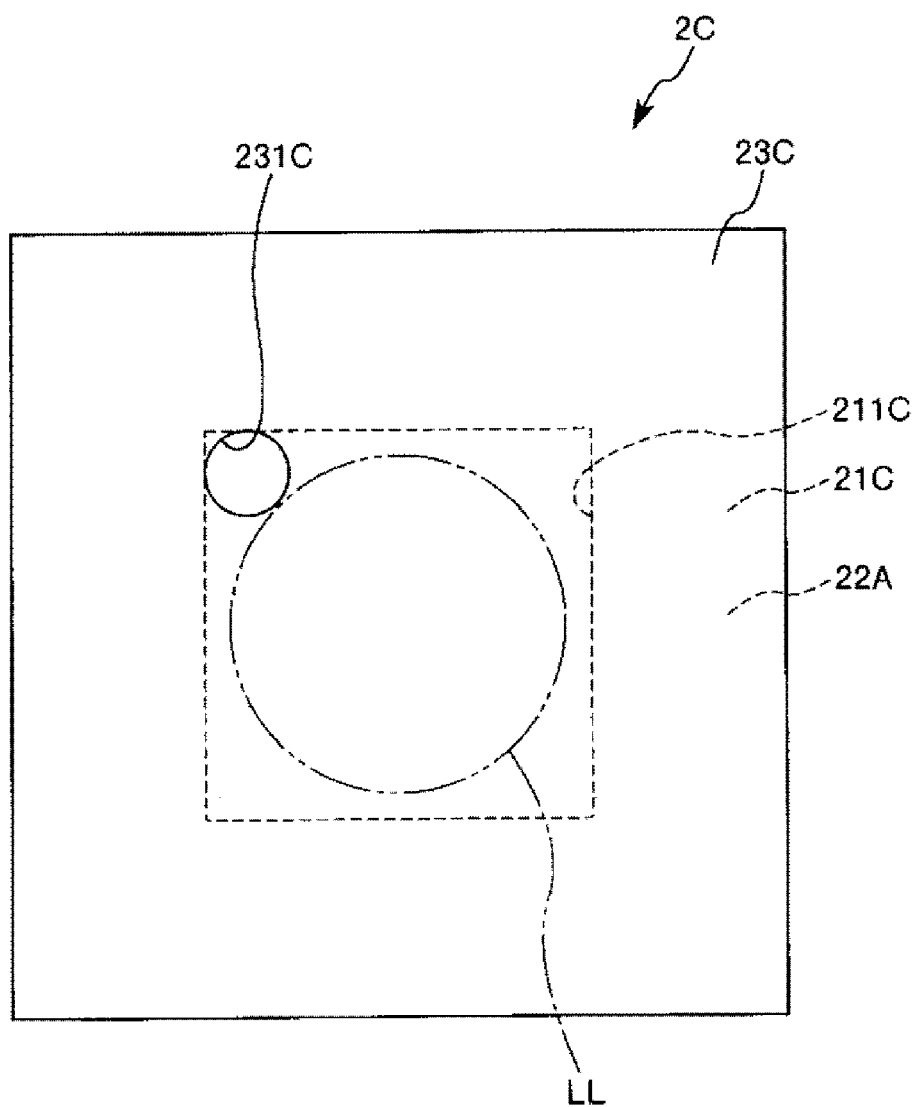
FIG. 15 is a plan view showing a gas cell according to a fourth embodiment of the invention.

FIG. 15 is a plan view showing a gas cell according to the fourth embodiment of the invention.

This embodiment is the same as the first embodiment except that the configuration of an atomic cell is different.

Note that, in the following explanation, concerning the fourth embodiment, differences from the embodiments explained above are mainly explained. Explanation of similarities to the embodiments is omitted. In FIG. 15, components same as the components in the embodiments are denoted by the same reference numerals and signs.

A gas cell 2C in this embodiment is the same as the gas cell 2 in the first embodiment except that the shape of an internal space is different and a hole of one window section of a pair of window sections is omitted.

The gas cell 2C includes a body section 21C including a through-hole 211C and a pair of window sections 22A and 23C that block both end openings of the through-hole 211C.

The through-hole 211C is formed in a square pole shape. In the window section 23C, a hole 231C is provided in a position corresponding to a corner of the through-hole 211C. Consequently, it is possible to increase the size of a transmission area of the excitation light LL in the internal space S.

Fifth Embodiment

A fifth embodiment of the invention is explained.

Figure 16:
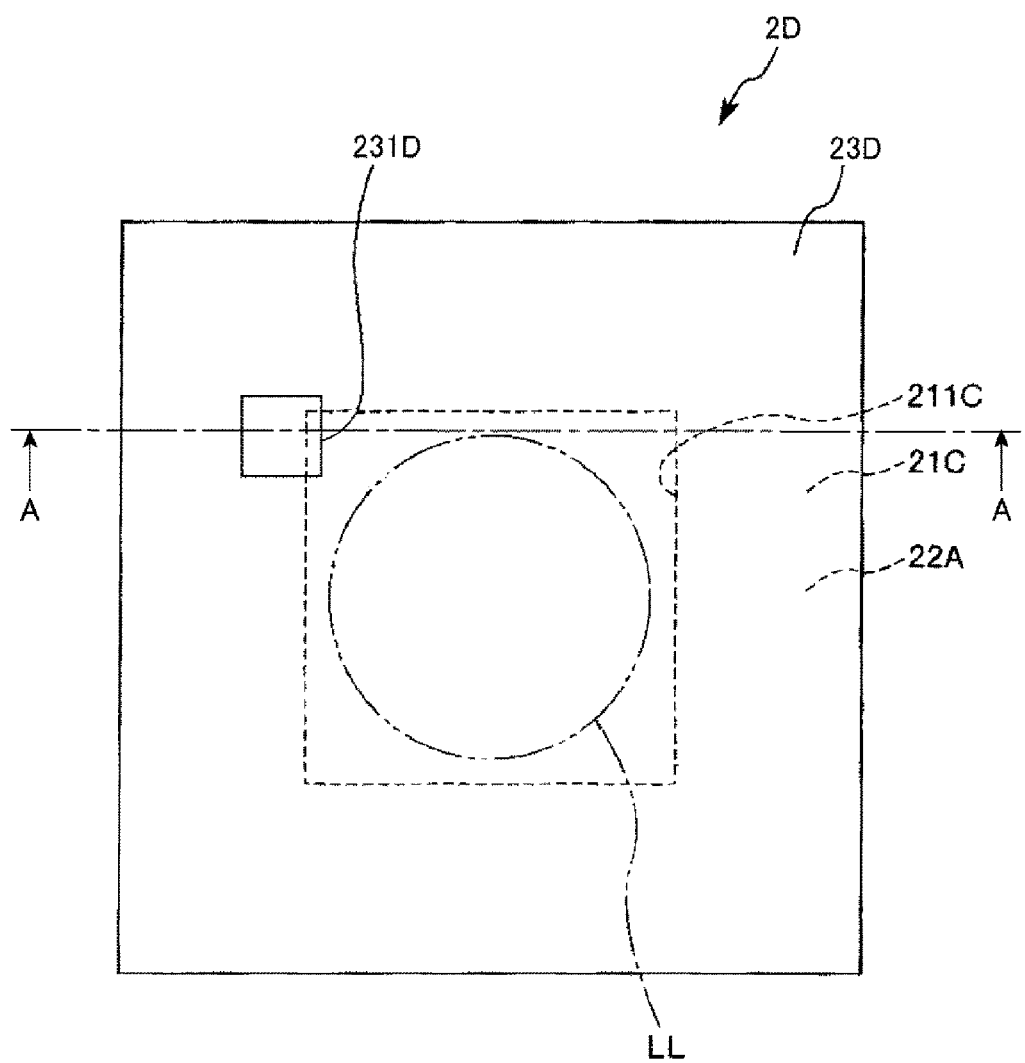
FIG. 16 is a plan view showing a gas cell according to a fifth embodiment of the invention.
Figure 17:
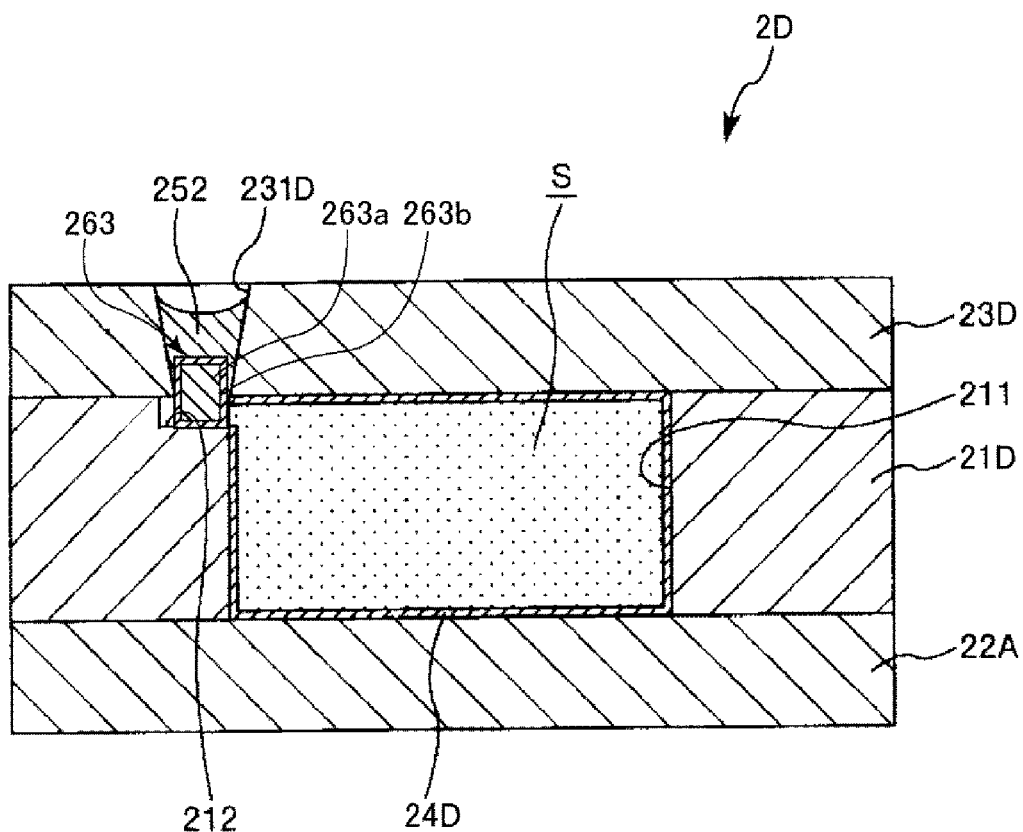
FIG. 17 is a sectional view taken along line A-A in FIG. 16.

FIG. 16 is a plan view showing a gas cell according to the fifth embodiment of the invention. FIG. 17 is a sectional view taken along line A-A in FIG. 16.

This embodiment is the same as the first embodiment except that the configuration of an atomic cell is different.

Note that, in the following explanation, concerning the fifth embodiment, differences from the embodiments explained above are mainly explained. Explanation of similarities to the embodiments is omitted. In FIGS. 16 and 17, components same as the components in the embodiments are denoted by the same reference numerals and signs.

A gas cell 2D in this embodiment includes, instead of the body section 21 and the window section 23 in the second embodiment, a body section 21D in which a groove 212 is formed and a window section 23D in which a hole 231D is formed. Both end openings of the through-hole 211 of the body section 21D are blocked by the window sections 22A and 23D, whereby the internal space S is formed. A coating film 24D is formed on the wall surface of the internal space S.

The groove 212 is formed on the surface of the body section 21D on the window section 23D side and allows the through-hole 211 and the hole 231D to communicate with each other. Consequently, when viewed from a direction in which the window sections 22A and 23D overlap, that is, an irradiation direction of excitation light, the hole 231D can be arranged in a position where the hole 231D does not overlap the internal space S. Therefore, it is possible to increase the size of a transmission area of the excitation light in the internal space S.

An opening of a through-hole, which includes the groove 212 and the hole 231D, on the internal space S side is formed in the body section 21D. Consequently, when viewed from a transmitting direction of the excitation light in the internal space S, the through-hole can be arranged in a position where the through-hole does not overlap the internal space S. Therefore, it is possible to increase the size of a transmission area of the excitation light in the internal space S.

In the through-hole including the groove 212 and the hole 231D, a coating member 263 is arranged on the internal space S side with respect to the sealing material 252.

In this embodiment, a cross sectional shape of the hole 231D is a square shape (see FIG. 16). The coating member 263 is formed in a rectangular parallelepiped shape to correspond to the square shape. Consequently, it is possible to form a portion of the coating member 263, which faces the internal space S, in a shape along the wall surface of the internal space S.

The coating member 263 is arranged to extend across the groove 212 and the hole 231D. Consequently, it is possible to regulate the coating member 263 from moving to the internal space S side.

Like the coating members 261 and 262 in the embodiments explained above, the coating member 263 includes a base material 263a and a coating layer 263b provided on the surface of the base material 263a.

2. Electronic Apparatus

The atomic oscillator explained above can be incorporated in various electronic apparatuses. The electronic apparatuses have excellent reliability.

An electronic apparatus according to the invention is explained below.

Figure 18:
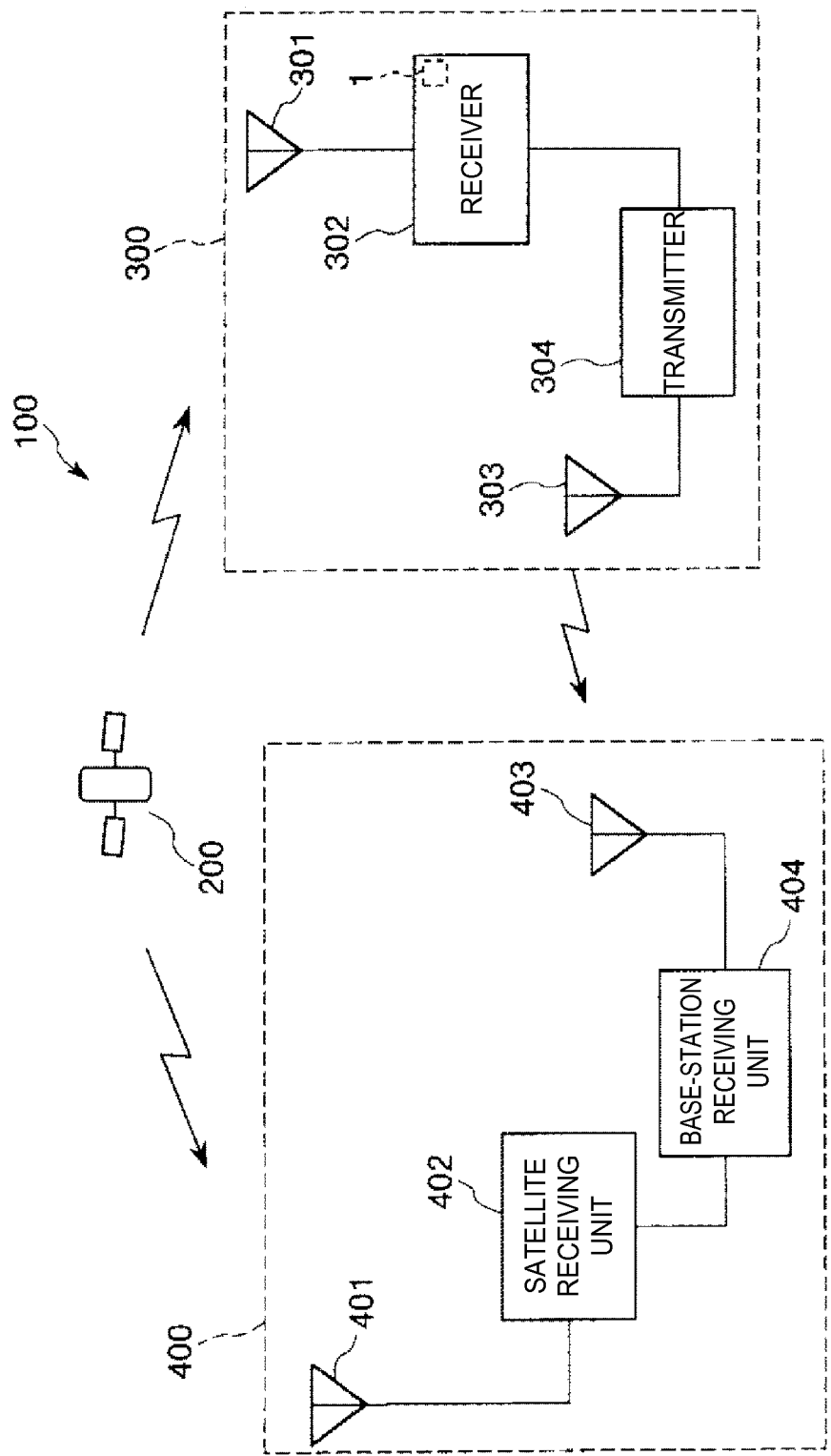
FIG. 18 is a diagram showing a schematic configuration in which an atomic oscillator according to the invention is used in a positioning system that makes use of a GPS satellite.

FIG. 18 is a diagram showing a schematic configuration in which the atomic oscillator according to the invention is used in a positioning system that makes use of a GPS satellite.

A positioning system 100 shown in FIG. 18 includes a GPS satellite 200, a base station apparatus 300, and a GPS receiver 400.

The GPS satellite 200 transmits positioning information (a GPS signal).

The base station apparatus 300 includes a receiver 302 that highly accurately receives positioning information from the GPS satellite 200 via an antenna 301 set in, for example, electronic reference point (a GPS continuous observation station) and a transmitter 304 that transmits, via an antenna 303, the positioning information received by the receiver 302.

The receiver 302 is an electronic apparatus including the atomic oscillator 1 according to the invention as a reference frequency oscillation source thereof. The receiver 302 has an excellent reliability. The positioning information received by the receiver 302 is transmitted by the transmitter 304 on a real time basis.

The GPS receiver 400 includes a satellite receiving unit 402 that receives positioning information from the GPS satellite 200 via an antenna 401 and a base-station receiving unit 404 that receives positioning information from the base station apparatus 300 via an antenna 403.

3. Moving Object

Figure 19:
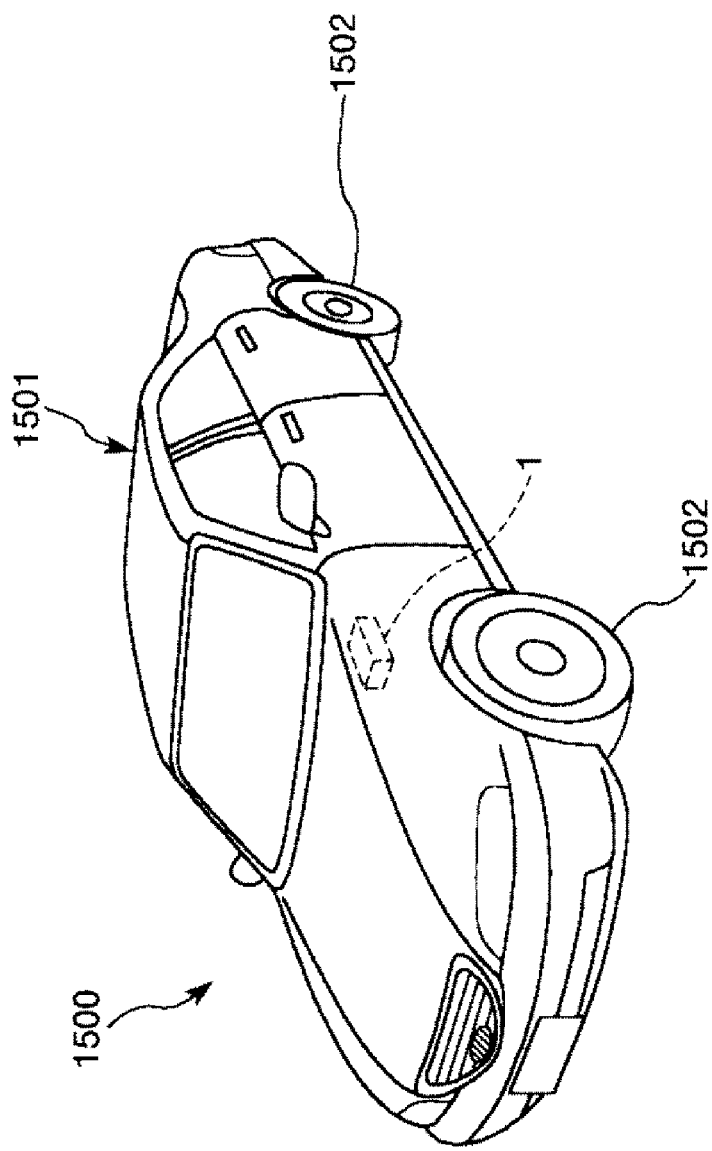
FIG. 19 is a diagram showing an example of a moving object of the invention.

FIG. 19 is a diagram showing an example of a moving object according to the invention.

In the figure, a moving object 1500 includes a vehicle body 1501 and four wheels 1502. The moving object 1500 is configured to rotate the wheels 1502 with a not-shown power source (an engine) provided in the vehicle body 1501. The atomic oscillator 1 is incorporated in the moving object 1500.

The moving object can exhibit excellent reliability.

Note that the electronic apparatus including the atomic oscillator according to the invention is not limited to those explained above. The electronic apparatus can be applied to, for example, a cellular phone, a digital still camera, an inkjet-type discharge apparatus (e.g., an inkjet printer), personal computers (a mobile personal computer and a laptop personal computer), a television, a video camera, a video tape recorder, a car navigation apparatus, a pager, an electronic notebook (including an electronic notebook with a communication function), an electronic dictionary, an electronic calculator, an electronic game machine, a word processor, a work station, a video phone, a security television monitor, an electronic binocular, a POS terminal, medical apparatuses (e.g., an electronic thermometer, a blood manometer, a blood sugar meter, an electrocardiogram apparatus, an ultrasonic diagnostic apparatus, and an electronic endoscope), a fish finder, various measuring apparatuses, meters (e.g., meters for a vehicle, an airplane, and a ship), a flight simulator, a ground digital broadcast, and a cellular phone base station.

The atomic cell, the manufacturing method for the atomic cell, the quantum interference device, the atomic oscillator, the electronic apparatus, and the moving object according to the invention are explained above on the basis of the embodiments shown in the figures. However, the invention is not limited to embodiments.

In the invention, one or two or more processes for any purposes may be added. In the invention, the components may be replaced with any components that exhibit functions same as the functions in the embodiments. Any components can also be added.

In the invention, any components in the embodiments may be combined with one another.

In the embodiments, the example is explained in which the main body section and the pair of window sections of the atomic cell are respectively configured from the separate members. However, the invention is not limited to this. For example, one window section of the pair of window sections and the main body section may be formed of the same member. In this case, for example, an internal space in which alkali metal is encapsulated only has to be formed by forming a recessed section, which opens to one surface of a substrate such as a silicon substrate or a glass substrate, and blocking the recessed section with another substrate.

The entire disclosure of Japanese Patent Application No. 2014-027032, filed Feb. 14, 2014 is expressly incorporated by reference herein.

What is claimed is:

1. An atomic cell comprising:
   a wall section configuring an internal space in which metal atoms are encapsulated;
   a coating film arranged on the wall section;
   a through-hole configured to allow the internal space and an outside to communicate with each other and pierce through the wall section; and
   a coating member separate and apart from the coating film, the coating member including a material having a characteristic the same as or similar to a characteristic of the coating film in an opening of the through-hole in plan view from the internal space side;
   a sealing material configured to seal the internal space; and
   a cushioning material arranged between the sealing material and the coating member,
   wherein at least a part of the coating member is arranged in the through-hole, and
   a portion of the coating member is separate and apart from the through-hole, and faces the internal space.

2. The atomic cell according to claim 1, wherein the sealing material is arranged further on an outer side than the coating member in the through-hole.

3. The atomic cell according to claim 2, wherein the sealing material include a glass.

4. The atomic cell according to claim 2, wherein the through-hole is formed in a shape with a width decreasing toward the internal space side.

5. The atomic cell according to claim 4, wherein a melting point of the cushioning material is lower than a melting point of the sealing material.

6. The atomic cell according to claim 1, wherein the coating film includes at least any one of a fluorine-based resin, a siloxane-based compound, and a chain saturated hydrocarbon.

7. The atomic cell according to claim 1, wherein the material of the coating member includes at least any one of a fluorine-based resin, a siloxane-based compound, and a chain saturated hydrocarbon.

8. A quantum interference device comprising:
   the atomic cell according to claim 1;
   a light emitting unit configured to emit excitation light for exciting the metal atoms; and
   a light detecting unit configured to detect the excitation light transmitted through the atomic cell.

9. The quantum interference device according to claim 8, wherein the atomic cell includes:

a pair of window sections through which the excitation light is transmitted; and a body section arranged between the pair of window sections, and the opening of the through-hole on the internal space side is arranged in the window section.

10. The quantum interference device according to claim 8, wherein the atomic cell includes:

a pair of window sections through which the excitation light is transmitted; and a body section arranged between the pair of window sections, and the opening of the through-hole on the internal space side is arranged in the body section.

11. An atomic oscillator comprising the atomic cell according to claim 1.

12. An electronic apparatus comprising the atomic cell according to claim 1.

13. A moving object comprising the atomic cell according to claim 1.

14. A manufacturing method for an atomic cell comprising:

preparing a structure including an internal space and a through-hole that allows the internal space and an outside to communicate with each other, metal atoms being arranged in the internal space and a coating film being arranged on a wall section of the internal space;

arranging a cushioning member between a coating member and a sealing material in the through-hole; and melting the sealing material to seal the through-hole in a state in which the coating member faces the internal space.

15. An atomic cell comprising:

a wall section configuring an internal space in which metal atoms are encapsulated;

a coating film arranged on the wall section;

a through-hole configured to allow the internal space and an outside to communicate with each other and pierce through the wall section;

a coating member separate and apart from the coating film, the coating member including a material having a characteristic the same as or similar to a characteristic of the coating film in an opening of the through hole in plan view from the internal space side, wherein the coating member includes a base material, and the material is a coating layer provided on a surface of the base material, the coating member is arranged within the through-hole, and the base material of the coating member is independent of the through-hole and the coating layer provided on the surface of the base material, and a portion of the coating layer faces the internal space, and a sealing material in the through-hole and arranged further on an outer side relative to the internal space than the coating member in the through-hole.

16. The atomic cell according to claim 15, wherein the material of the coating member includes at least any one of a fluorine-based resin, a siloxane-based compound, and a chain saturated hydrocarbon.

17. A quantum interference device comprising:

the atomic cell according to claim 15;

a light emitting unit configured to emit excitation light for exciting the metal atoms; and a light detecting unit configured to detect the excitation light transmitted through the atomic cell.

18. An atomic oscillator comprising the atomic cell according to claim 15.

19. An electronic apparatus comprising the atomic cell according to claim 15.

20. A moving object comprising the atomic cell according to claim 15.

* * * * *